United States Patent
Shimasaki et al.

(10) Patent No.: US 10,866,142 B2
(45) Date of Patent: *Dec. 15, 2020

(54) OPTICAL SENSOR

(71) Applicant: PANASONIC INTELLECTUAL PROPERTY MANAGEMENT CO., LTD., Osaka (JP)

(72) Inventors: Naoki Shimasaki, Osaka (JP); Tokuhiko Tamaki, Osaka (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/391,160

(22) Filed: Apr. 22, 2019

(65) Prior Publication Data

US 2019/0250042 A1    Aug. 15, 2019

Related U.S. Application Data

(63) Continuation of application No. 15/662,654, filed on Jul. 28, 2017, now Pat. No. 10,317,287, which is a (Continued)

(30) Foreign Application Priority Data

Nov. 12, 2015 (JP) .................... 2015-222063
May 31, 2016 (JP) .................... 2016-108610

(51) Int. Cl.
*G01J 5/08* (2006.01)
*G01J 1/04* (2006.01)
(Continued)

(52) U.S. Cl.
CPC ........... *G01J 5/0853* (2013.01); *G01J 1/0407* (2013.01); *G01J 1/42* (2013.01); *G01J 3/36* (2013.01);
(Continued)

(58) Field of Classification Search
CPC .......... G01J 5/0853; G01J 1/0407; G01J 1/42; G01J 3/36; G01J 5/0846; G01J 5/20;
(Continued)

(56) References Cited

U.S. PATENT DOCUMENTS 4,587,426 A    5/1986  Munier et al.
4,698,657 A   10/1987  Watanabe et al.
(Continued)

FOREIGN PATENT DOCUMENTS

JP    60-167466 A    8/1985
JP    60-194345 A   10/1985
(Continued)

OTHER PUBLICATIONS

Non-Final Office Action issued in U.S. Appl. No. 15/662,654, dated Jul. 19, 2018.
(Continued)

*Primary Examiner* — Taeho Jo
(74) *Attorney, Agent, or Firm* — McDermott Will & Emery LLP

(57) ABSTRACT

An optical sensor including: a semiconductor layer including a source region and a drain region; a gate electrode facing a region between the source region and the drain region; a photoelectric conversion layer between the region and the gate electrode; and a first transistor having a first gate coupled to one of the source region and the drain region.

20 Claims, 21 Drawing Sheets

Related U.S. Application Data continuation of application No. PCT/JP2016/004726, filed on Oct. 27, 2016.

(51) Int. Cl.

| | |
|---|---|
| *G01J 1/42* | (2006.01) |
| *G01J 3/36* | (2006.01) |
| *G01J 5/20* | (2006.01) |
| *H04N 5/3745* | (2011.01) |
| *H04N 5/357* | (2011.01) |
| *H04N 5/33* | (2006.01) |
| *H04N 3/14* | (2006.01) |
| *H04N 5/232* | (2006.01) |
| *H04N 5/378* | (2011.01) |
| *H01L 27/146* | (2006.01) |

(52) U.S. Cl.
CPC ............... *G01J 5/0846* (2013.01); *G01J 5/20* (2013.01); *H01L 27/14609* (2013.01); *H01L 27/14643* (2013.01); *H01L 27/14665* (2013.01); *H01L 27/14676* (2013.01); *H04N 3/1512* (2013.01); *H04N 5/23241* (2013.01); *H04N 5/33* (2013.01); *H04N 5/3575* (2013.01); *H04N 5/378* (2013.01); *H04N 5/3745* (2013.01)

(58) Field of Classification Search
CPC ......... H01L 27/14609; H01L 27/14643; H01L 27/14665; H01L 27/14676; H04N 3/1512; H04N 5/23241; H04N 5/33; H04N 5/3575; H04N 5/3745; H04N 5/378
USPC ...................................................... 250/338.1
See application file for complete search history.

(56) References Cited

U.S. PATENT DOCUMENTS

| | | | | |
|---|---|---|---|---|
| 5,122,666 | A * | 6/1992 | Turnbull | G01J 5/10 250/338.1 |
| 5,591,963 | A | 1/1997 | Takeda et al. | |
| 6,127,692 | A * | 10/2000 | Sugawa | H01L 27/14609 257/30 |
| 2004/0222420 | A1* | 11/2004 | Chang | G06K 9/0004 257/59 |
| 2005/0258425 | A1* | 11/2005 | Izumi | H01L 27/14665 257/72 |
| 2006/0012000 | A1* | 1/2006 | Estes | B82Y 15/00 257/425 |
| 2006/0113623 | A1* | 6/2006 | Park | H01L 27/14687 257/444 |
| 2006/0146161 | A1* | 7/2006 | Farrier | H04N 5/35545 348/308 |
| 2006/0181627 | A1* | 8/2006 | Farrier | H04N 5/35545 348/308 |
| 2006/0187327 | A1* | 8/2006 | Mabuchi | H01L 27/1464 348/294 |
| 2007/0108384 | A1* | 5/2007 | Mueller | G01J 5/38 250/338.1 |
| 2008/0230123 | A1* | 9/2008 | Mitsui | H01L 51/447 136/263 |
| 2010/0032548 | A1* | 2/2010 | Murata | H01L 27/305 250/206 |
| 2010/0134735 | A1* | 6/2010 | Nakamura | H01L 31/1055 349/116 |
| 2010/0224880 | A1* | 9/2010 | Kimura | H01L 27/1225 257/59 |
| 2011/0024859 | A1* | 2/2011 | Miyazaki | H01L 27/14645 257/432 |
| 2011/0116078 | A1* | 5/2011 | Cho | H01L 27/14632 356/51 |
| 2011/0198499 | A1* | 8/2011 | Park | H01L 31/107 250/332 |
| 2011/0272581 | A1* | 11/2011 | Noda | G01J 5/023 250/338.3 |
| 2012/0175686 | A1* | 7/2012 | Hirota | H01L 27/14656 257/225 |
| 2013/0093035 | A1* | 4/2013 | Fertig | H01L 31/1105 257/432 |
| 2013/0214371 | A1* | 8/2013 | Asatsuma | H01L 27/14636 257/432 |
| 2013/0320309 | A1* | 12/2013 | Kim | H01L 27/14603 257/40 |
| 2013/0341491 | A1* | 12/2013 | Hirose | H01L 27/14638 250/208.1 |
| 2014/0103192 | A1* | 4/2014 | Lee | H01L 27/14643 250/208.1 |
| 2015/0076649 | A1* | 3/2015 | Kim | H01L 27/14689 257/446 |
| 2015/0153236 | A1* | 6/2015 | Yagami | G01J 5/20 374/130 |
| 2015/0263177 | A1* | 9/2015 | Yamazaki | H01L 21/02565 257/43 |
| 2015/0380450 | A1* | 12/2015 | Okamoto | H01L 27/14616 257/43 |
| 2016/0013328 | A1* | 1/2016 | Tashiro | H01L 31/0232 250/208.1 |
| 2016/0035779 | A1* | 2/2016 | Ryoki | H04N 5/363 348/241 |
| 2016/0035920 | A1* | 2/2016 | Tashiro | H04N 5/37452 250/208.1 |
| 2016/0094236 | A1* | 3/2016 | Shionoiri | H03M 1/002 341/122 |
| 2016/0126283 | A1* | 5/2016 | Ohmaru | H04N 5/37457 348/374 |
| 2016/0190330 | A1* | 6/2016 | Yamazaki | H01L 29/78693 257/43 |

FOREIGN PATENT DOCUMENTS

| | | |
|---|---|---|
| JP | 01-277746 A | 11/1989 |
| JP | 2-137267 A | 5/1990 |
| JP | 08-064793 A | 3/1996 |
| JP | 2008-227091 A | 9/2008 |
| JP | 2011-060830 A | 3/2011 |
| JP | 2015-108545 A | 6/2015 |
| WO | 92/002959 A1 | 2/1992 |

OTHER PUBLICATIONS

Notice of Allowance issued in U.S. Appl. No. 15/662,654, dated Jan. 22, 2019.
International Search Report of PCT Application No. PCT/JP2016/004726 dated Jan. 10, 2017.

* cited by examiner

OPTICAL SENSOR

CROSS-REFERENCE OF RELATED APPLICATIONS

This application is a Continuation of U.S. patent application Ser. No. 15/662,654, filed on Jul. 28, 2017, which is a Continuation of International Patent Application No. PCT/JP2016/004726, filed on Oct. 27, 2016, which in turn claims the benefit of Japanese Application No. 2015-222063, filed on Nov. 12, 2015 and Japanese Application No. 2016-108610, filed on May 31, 2016, the entire disclosures of which Applications are incorporated by reference herein.

BACKGROUND

1. Technical Field

The present disclosure relates to an optical sensor.

2. Description of the Related Art

An optical detection element has so far been used in an optical sensor, an image sensor, etc. A typical example of the optical detection element is a photoelectric conversion element, such as a photodiode or a phototransistor. As well known, light can be detected by detecting a photocurrent that is generated in the photoelectric conversion element with light irradiation.

Japanese Unexamined Patent Application Publication No. 2011-60830 discloses, in FIG. 2, a thin film transistor (TFT) including, as a gate insulating film, an organic film in which a predetermined compound is dispersed in an organic polymer. A compound of which polarized state is changed with light irradiation is selected as the predetermined compound constituting the organic film. In the thin film transistor disclosed in Japanese Unexamined Patent Application Publication No. 2011-60830, the dielectric constant of the gate insulating film is changed when the gate insulating film is irradiated with light. Accordingly, a current flowing between a source and a drain is changed with the light irradiation of the gate insulating film. Japanese Unexamined Patent Application Publication No. 2011-60830 sets forth that the above-mentioned type of thin film transistor can be used as a photosensor.

SUMMARY

One non-limiting and exemplary embodiment provides an optical sensor with a novel configuration.

In one general aspect, the techniques disclosed here feature an optical sensor including: a semiconductor layer including a source region and a drain region; a gate electrode facing a region between the source region and the drain region; a photoelectric conversion layer between the region and the gate electrode; and a first transistor having a first gate coupled to one of the source region and the drain region.

It should be noted that general or specific embodiments may be implemented as an element, a device, an apparatus, a system, an integrated circuit, or a method. It should be noted that general or specific embodiments may also be implemented as any selective combination of an element, a device, an apparatus, a system, an integrated circuit, and a method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
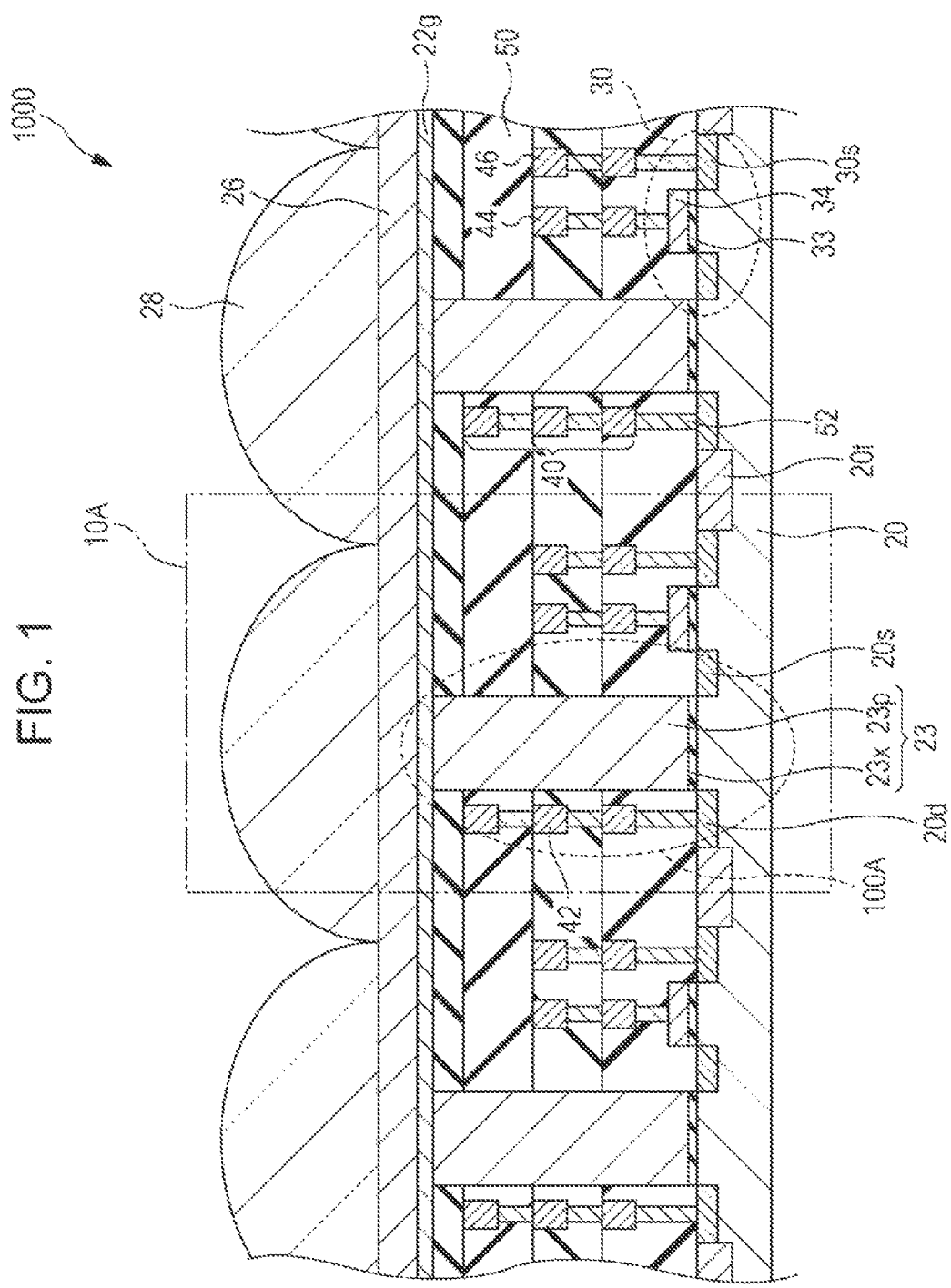
FIG. 1 is a schematic sectional view illustrating a section of an exemplary optical sensor according to a first embodiment of the present disclosure.

Embodiments of the present disclosure are summarized as follows.

Item 1

An optical sensor comprising:

a semiconductor layer including a first region, a second region, and a third region between the first region and the second region;

a gate electrode facing to the semiconductor layer;

a gate insulating layer between the third region and the gate electrode, the gate insulating layer including a photoelectric conversion layer;

a signal detection circuit including a first signal detection transistor, a first input of the first signal detection transistor being electrically connected to the first region;

a first transfer transistor connected between the first region and the first input; and a first capacitor having one end electrically connected to the first input, wherein the signal detection circuit detects an electrical signal corresponding to a change of a dielectric constant of the photoelectric conversion layer, the change being caused by incident light.

With the features set forth in Item 1, the optical sensor can be realized in which an output signal can be read out at timing different from timing of exposure.

Item 2

The optical sensor according to Item 1, wherein the gate insulating layer includes an insulating layer between the photoelectric conversion layer and the semiconductor layer.

With the feature set forth in Item 2, a leak current in the photoelectric conversion layer can be reduced, and a demanded S/N ratio can be ensured.

Item 3

The optical sensor according to Items 1 or 2, further comprising a light-shielding film between the gate electrode and the semiconductor layer.

With the feature set forth in Item 3, since stray light can be suppressed from entering a channel region formed between the source region and the drain region, it is possible to suppress mixing of noise, such as color mixing between adjacent unit pixel cells.

Item 4

The optical sensor according to any one of Items 1 to 3, wherein the photoelectric conversion layer has a photocurrent characteristic between a bias voltage applied to the photoelectric conversion layer and a current density of a current flowing through the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density to the bias voltage is less than in the first voltage range and the second voltage range, the third voltage range being between the first voltage range and the second voltage range.

With the feature set forth in Item 4, the optical sensor having good responsivity can be provided. For example, an infrared sensor having good responsivity can be realized.

Item 5

The optical sensor according to Item 4, further comprising a voltage supply circuit supplying a predetermined voltage between the gate electrode and the second region such that the bias voltage falls within the third voltage range, wherein the first region outputs the electrical signal corresponding to the change of the dielectric constant of the photoelectric conversion layer when the voltage supply circuit supplies the predetermined voltage.

With the features set forth in Item 5, the potential difference within the third voltage range can be applied between principal surfaces of the photoelectric conversion layer.

Item 6

The optical sensor according to any one of Items 1 to 5, wherein the signal detection circuit includes a second signal detection transistor, a second input of the second signal detection transistor being electrically connected to the first region, and the optical sensor further comprises:

a second transfer transistor connected between the second input and the first region; and a second capacitor having one end electrically connected to the second input.

With the features set forth in Item 6, light can be detected in multiple phases different from each other with a single pixel.

Item 7

The optical sensor according to any one of Items 1 to 6, further comprising a first current amplifier circuit electrically connected between the one end of the first capacitor and the first region.

With the feature set forth in Item 7, signal detection with higher sensitivity can be realized.

Item 8

The optical sensor according to any one of Items 1 to 7, further comprising an inverting amplifier electrically connected between the one end of the first capacitor and the first region.

With the feature set forth in Item 8, linearity between illuminance and the output signal from the unit pixel cell can be improved.

Item 9

An optical sensor comprising:

a first electrode;

a second electrode facing to the first electrode;

a photoelectric conversion layer between the first electrode and the second electrode;

a field effect transistor having a gate, a source and a drain, the gate being electrically connected to the first electrode;

a signal detection circuit including a first signal detection transistor, a first input of the first signal detection transistor being electrically connected to one of the source and the drain;

a first transfer transistor connected between the first input and the one of the source and the drain; and a first capacitor having one end electrically connected to the first input, wherein the signal detection circuit detects an electrical signal corresponding to a change of a dielectric constant of the photoelectric conversion layer, the change being caused by incident light.

With the features set forth in Item 9, the optical sensor can be realized in which an output signal can be read out at timing different from timing of exposure.

Item 10

The optical sensor according to Item 9, wherein the photoelectric conversion layer has a photocurrent characteristic between a bias voltage applied to the photoelectric conversion layer and an current density of a current flowing through the photoelectric conversion layer, the photocurrent characteristic including a first voltage range where an absolute value of the current density increases as the bias voltage increases in a reverse direction, a second voltage range where the current density increases as the bias voltage increases in a forward direction, and a third voltage range where an absolute value of a rate of change of the current density to the bias voltage is less than in the first voltage range and the second voltage range, the third voltage range being between the first voltage range and the second voltage range.

Item 11

The optical sensor according to Item 10, further comprising at least one of a first insulating layer and a second insulating layer, the first insulating layer being sandwiched between the first electrode and the photoelectric conversion layer, the second insulating layer being sandwiched between the second electrode and the photoelectric conversion layer.

With the feature set forth in Item 11, a larger bias voltage can be applied between the source or the drain of the field effect transistor and the second electrode.

Item 12

The optical sensor according to Item 11, further comprising
a voltage supply circuit supplying a predetermined voltage between the second electrode and the other of the source and the drain such that the bias voltage falls within the first voltage range, wherein
the one of the source and the drain outputs the electrical signal corresponding to the change of the dielectric constant of the photoelectric conversion layer when the voltage supply circuit supplies the predetermined voltage.

With the features set forth in Item 12, the potential difference within the first voltage range can be applied between the principal surfaces of the photoelectric conversion layer.

Item 13

The optical sensor according to Item 10 or 11, further comprising
a voltage supply circuit supplying a predetermined voltage between the second electrode and the other of the source and the drain such that the bias voltage falls within the third voltage range, wherein
the one of the source and the drain outputs the electrical signal corresponding to the change of the dielectric constant of the photoelectric conversion layer when the voltage supply circuit supplies the predetermined voltage.

With the features set forth in Item 13, the potential difference within the third voltage range can be applied between the principal surfaces of the photoelectric conversion layer.

Item 14

The optical sensor according to any one of Items 9 to 13, wherein the first electrode has a light-shielding property.

With the feature set forth in Item 14, since stray light can be suppressed from entering a channel region of the field effect transistor, it is possible to suppress mixing of noise, such as color mixing between the adjacent unit pixel cells.

Item 15

The optical sensor according to any one of Items 9 to 14, further comprising a connector connecting the gate and the first electrode to each other.

With the feature set forth in Item 15, a degree of freedom in design of wirings arranged between the semiconductor layer and the first electrode is increased.

Item 16

The optical sensor according to any one of Items 9 to 15, wherein
the signal detection circuit includes a second signal detection transistor, a second input of the second signal detection transistor being electrically connected to the one of the source and the drain, and
the optical sensor further comprises:
a second transfer transistor connected between the second input and the one of the source and the drain; and
a second capacitor having one end electrically connected to the second input.

With the features set forth in Item 16, light can be detected in multiple phases different from each other with a single pixel.

Item 17

The optical sensor according to any one of Items 9 to 16, further comprising a first current amplifier circuit electrically connected between the one end of the first capacitor and the one of the source and the drain.

With the feature set forth in Item 17, signal detection with higher sensitivity can be realized.

Item 18

The optical sensor according to Item any one of Items 9 to 17, further comprising an inverting amplifier electrically connected between the one end of the first capacitor and the one of the source and the drain.

With the feature set forth in Item 18, linearity between illuminance and the output signal from the unit pixel cell can be improved.

Embodiments of the present disclosure will be described in detail below with reference to the drawings. It is to be noted that any of the following embodiments represents a general or specific example. Thus, numerical values, shapes, materials, components, arrangements and connected forms of the components, steps, sequences of the steps, and so on, which are described in the following embodiments, are merely illustrative, and they are not purported to limit the present disclosure. The individual embodiments described in this specification can be combined with each other insofar as not causing contradictions. Among the components in the following embodiments, those ones other than the components not stated in an independent claim, which defines the most significant concept, are explained as being components that can be optionally used. In the following description, the components having substantially the same functions are denoted by common reference sings and description of those components is omitted in some cases.

First Embodiment

FIG. 1 schematically illustrates a section of an exemplary optical sensor according to a first embodiment of the present disclosure. An optical sensor 1000 illustrated in FIG. 1 includes a plurality of unit pixel cells 10A each including a photosensor 100A. The plurality of unit pixel cells 10A are arrayed in a matrix pattern, for example, and they form a photosensor array. FIG. 1 schematically illustrates respective sections of three unit pixel cells 10A, which are arranged in a row direction of the photosensor array, among the plurality of unit pixel cells 10A. It is to be noted that FIG. 1 merely schematically illustrates the layout of individual components constituting the optical sensor 1000, and that sizes of the components illustrated in FIG. 1 do not always exactly reflect the sizes in an actual device. Such a point is similarly applied to the other drawings in the present disclosure. Furthermore, in the following, some of the components are omitted from drawings in some cases for the sake of avoiding the drawings from being complicated excessively.

The unit pixel cells 10A are formed in and on a semiconductor substrate 20. In this embodiment, the semiconductor substrate 20 is, for example, a p-type silicon (Si) substrate. The unit pixel cells 10A are electrically isolated from each other by element isolation regions 20t that are formed in the semiconductor substrate 20. A distance (pixel pitch) between adjacent two of the unit pixel cells 10A may be about 2 µm, for example. The "semiconductor substrate" used in this specification is not limited to a substrate that is entirely a semiconductor layer, and it may be, for example, an insulating substrate including a semiconductor layer that is formed on a surface at the side irradiated with light.

The photosensor 100A in the unit pixel cell 10A has a device structure substantially similar to that of a field effect transistor (FET). In more detail, the photosensor 100A includes impurity regions (n-type regions in this embodiment) 20s and 20d that are both formed in the semiconductor substrate 20, a gate insulating layer 23 that is arranged on a region sandwiched between the impurity regions 20s and 20d both formed in the semiconductor substrate 20, and a transparent gate electrode 22g that is arranged on the gate insulating layer 23. As illustrated in FIG. 1, the transparent gate electrode 22g is arranged on an interlayer insulating layer 50 covering the semiconductor substrate 20.

In the configuration illustrated in FIG. 1, the interlayer insulating layer 50 has a multilayer structure including a plurality of insulating layers (typically, silicon oxide films). A multilayer wiring 40 is disposed in the interlayer insulating layer 50. The multilayer wiring 40 includes a plurality of wiring layers. In the configuration illustrated in FIG. 1, the multilayer wiring 40 includes three wiring layers. A power supply wiring line 42, an address control line 44, and a vertical signal line 46 are disposed in middle one of the three wiring layers. The power supply wiring line 42, the address control line 44, and the vertical signal line 46 extend, for example, along a direction perpendicular to the drawing sheet (i.e., in a column direction in the photosensor array). In the example illustrated in FIG. 1, the interlayer insulating layer 50 and the multilayer wiring 40 include four insulating layers and three wiring layers, respectively. However, the number of the insulating layers in the interlayer insulating layer 50 and the number of the wiring layers in the multilayer wiring 40 are not limited to the above-mentioned examples.

In the configuration illustrated in FIG. 1, the power supply wiring line 42 in the multilayer wiring 40 is connected to the impurity region 20d through a contact plug 52. As described later, a power supply for supplying a predetermined voltage is connected to the power supply wiring line 42. During the operation of the optical sensor 1000, a predetermined bias voltage (first bias voltage) is applied to the impurity region 20d through the power supply wiring line 42.

The gate insulating layer 23 penetrates through the interlayer insulating layer 50 and interconnects an upper surface of the semiconductor substrate 20 and a lower surface of the transparent gate electrode 22g. It is to be noted that the words "upper surface" and "lower surface" in this specification are used to represent a relative positional relation in arrangement of members and are not intended to limit a posture of the optical sensor according to the present disclosure.

The gate insulating layer 23 includes a photoelectric conversion layer 23p. A thickness of the photoelectric conversion layer 23p (i.e., a length measured along a normal direction of the semiconductor substrate 20) is about 1500 nm, for example. Details of a typical example of configuration of the photoelectric conversion layer 23p will be described later. In the configuration illustrated in FIG. 1, an insulating layer 23x is disposed between the photoelectric conversion layer 23p and the semiconductor substrate 20. The insulating layer 23x may be in contact with the semiconductor substrate 20.

In the example illustrated in FIG. 1, the transparent gate electrode 22g on the interlayer insulating layer 50 is formed to extend over the plurality of unit pixel cells 10A. The transparent gate electrode 22g is connected to the power supply (not illustrated). Similarly to the impurity region 20d in the semiconductor substrate 20, the transparent gate electrode 22g is constituted such that, during the operation of the optical sensor 1000, a predetermined bias voltage (second bias voltage) can be applied to the transparent gate electrode 22g.

During the operation of the optical sensor 1000, because the predetermined voltages are applied respectively to the transparent gate electrode 22g and the impurity region 20d, a potential difference between the transparent gate electrode 22g and the impurity region 20d is maintained constant. Insofar as the potential difference between the transparent gate electrode 22g and the impurity region 20d can be maintained constant during the operation, it is not always needed that the transparent gate electrode 22g is formed to extend over the plurality of unit pixel cells 10A. In another example, the transparent gate electrode 22g may be formed in a state separated for each of the unit pixel cells 10A.

As described in detail later, in an operation of detecting light, the light is applied to the optical sensor 1000 from one side of the photosensor 100A, the side including the transparent gate electrode 22g, (i.e., from the upper side in FIG. 1), in the state where the potential difference between the transparent gate electrode 22g and the impurity region 20d is maintained constant. The light applied to the optical sensor 1000 enters the photoelectric conversion layer 23p of the gate insulating layer 23 through the transparent gate electrode 22g. Upon irradiation with the incident light, the photoelectric conversion layer 23p generates electron-hole pairs, for example. The dielectric constant of the photoelectric conversion layer 23p is changed with the generation of electron-hole pairs in the photoelectric conversion layer 23p. Assuming the photosensor 100A to be a field effect transistor, a change of the dielectric constant of the photoelectric conversion layer 23p provides a similar effect to that obtained when a gate capacitance of the field effect transistor is changed. In other words, a threshold voltage of the field effect transistor is changed with the light irradiation of the gate insulating layer 23. The light can be detected by utilizing the change of the threshold voltage.

In view of the above-described principle of operation, the photosensor 100A may be called a capacitance-modulated transistor. The impurity regions 20s and 20d correspond to, for example, a source region and a drain region of the capacitance-modulated transistor, respectively. In the following description, the impurity region 20s is called a source region (or a drain region) of the photosensor, and the impurity region 20d is called a drain region (or a source region) of the photosensor in some cases. Moreover, in the following description, a current flowing between the impurity regions 20s and 20d is simply called a drain current for the sake of simplicity in some cases.

The light incident upon the photosensor 100A can be detected by detecting a change of the threshold voltage in the capacitance-modulated transistor with an appropriate detection circuit. As described later, the optical sensor 1000 may include a signal detection circuit that is electrically connected to the impurity region 20s. The signal detection circuit detects an electrical signal (i.e., a voltage signal or a current signal) corresponding to a change of the dielectric constant of the photoelectric conversion layer 23p, the change being caused by incidence of the light upon the photoelectric conversion layer 23p through the transparent gate electrode 22g.

In the example illustrated in FIG. 1, an infrared transmission filter 26 selectively allowing infrared rays to transmit therethrough is disposed on the transparent gate electrode 22g. In other words, FIG. 1 illustrates the configuration of the optical sensor 1000 when the optical sensor 1000 is utilized as an infrared detection device. Thus, the light detected by the optical sensor 1000 is not limited to light within the wavelength range of visible light (e.g., 380 nm or more to 780 nm or less). In this specification, overall electromagnetic waves including infrared rays and ultraviolet rays are expressed by "light" for the sake of convenience. The words "transparent" and "light transmission" used in this specification stand for the property of allowing transmission of at least part of light in a wavelength range to be detected, and it is not essential to allow transmission of light in the entire wavelength range of visible light.

When the optical sensor 1000 is utilized as an infrared detection device, a transparent conducting oxide (TCO) having a high transmittance for near infrared rays and a small resistance value is used as a material of the transparent gate electrode 22g. For example, ITO, IZO, AZO, FTO, $SnO_2$, $TiO_2$, or $ZnO_2$ can be used as TCO. Alternatively, a metal thin film made of Au, for example, may be used as the transparent gate electrode 22g. As illustrated in FIG. 1, a microlens 28 for condensing the irradiation light to be incident upon the photoelectric conversion layer 23p may be arranged on the infrared transmission filter 26. A protective layer may be arranged between the microlens 28 and the transparent gate electrode 22g.

In the configuration illustrated in FIG. 1, each unit pixel cell 10A includes an address transistor 30. In the example schematically illustrated in FIG. 1, the address transistor 30 includes the impurity region 20s and an impurity region 30s both formed in the semiconductor substrate 20, a gate insulating layer 33, and a gate electrode 34. In the following, an N-channel MOSFET is used as the transistor, by way of example, unless otherwise specified.

The gate insulating layer 33 is, for example, a thermal oxide film of silicon (i.e., a silicon dioxide film). The gate electrode 34 is, for example, a polysilicon electrode. In the illustrated example, the address transistor 30 and the photosensor 100A share the impurity region 20s. By sharing the impurity region 20s, the address transistor 30 and the photosensor 100A are electrically connected to each other.

The impurity region 20s in the address transistor 30 functions, for example, as a drain region of the address transistor 30. The impurity region 30s in the address transistor 30 functions, for example, as a source region of the address transistor 30. In a configuration that the optical sensor 1000 includes a plurality of unit pixel cells and the address transistor 30 is disposed for each of the unit pixel cells, a signal detection circuit is connected to an output of the address transistor 30 (i.e., to the impurity region 30s in the illustrated example). As described later with reference to the drawing, a capacitor, a transfer transistor for transferring signal charges output from the photosensor 100A to the capacitor, and so on may be connected between the photosensor 100A and the address transistor 30. For example, the so-called global shutter operation can be provided by disposing, within the unit pixel cell, a capacitor having one end electrically connected to an input stage of the signal detection circuit. When the number of the unit pixel cells included in the optical sensor 1000 is one, the address transistor 30 for selecting the cell from which a signal is to be read out may be omitted. In other words, when the number of the unit pixel cells is one, the address transistor 30 can be caused to function as the transfer transistor.

In the illustrated example, the gate electrode 34 (typically a polysilicon electrode) of the address transistor 30 is connected to the address control line 44 of the multilayer wiring 40 through the contact plug 52. The impurity region 30s of the address transistor 30 is connected to the vertical signal line 46 of the multilayer wiring 40 through the contact plug 52. Accordingly, a signal generated by the photosensor 100A can be selectively read out through the vertical signal line 46 by controlling a potential of the gate electrode 34 through the address control line 44 so as to turn on the address transistor 30.

The above-mentioned multilayer wiring 40 including the vertical signal line 46, etc. as part thereof is formed of a metal such as copper, for example. A light-shielding film may be formed by one wiring layer in the multilayer wiring 40. By causing one wiring layer arranged within the interlayer insulating layer 50 to function as a light-shielding film, part of the light having transmitted through the transparent gate electrode 22g, the part having not entered the photoelectric conversion layer 23p, can be blocked by the light-shielding wiring layer. As a result, the light (infrared rays in this embodiment) having not entered the photoelectric conversion layer 23p can be suppressed from entering a channel region of a transistor (e.g., the capacitance-modulated transistor or the address transistor 30) that is formed in and on the semiconductor substrate 20. The insulating layer 23x and/or the gate insulating layer 33 may have a light-shielding property. By suppressing incidence of stray light upon the channel region, it is possible to suppress mixing of noise, such as color mixing between the unit pixel cells adjacent to each other. Of the light having transmitted through the transparent gate electrode 22g, most part going toward the photoelectric conversion layer 23p is absorbed by the photoelectric conversion layer 23p. Therefore, the light going toward the photoelectric conversion layer 23p does not adversely affect the operation of the transistor formed in and on the semiconductor substrate 20.

Exemplary Circuit Configuration of Optical Sensor

Figure 2:
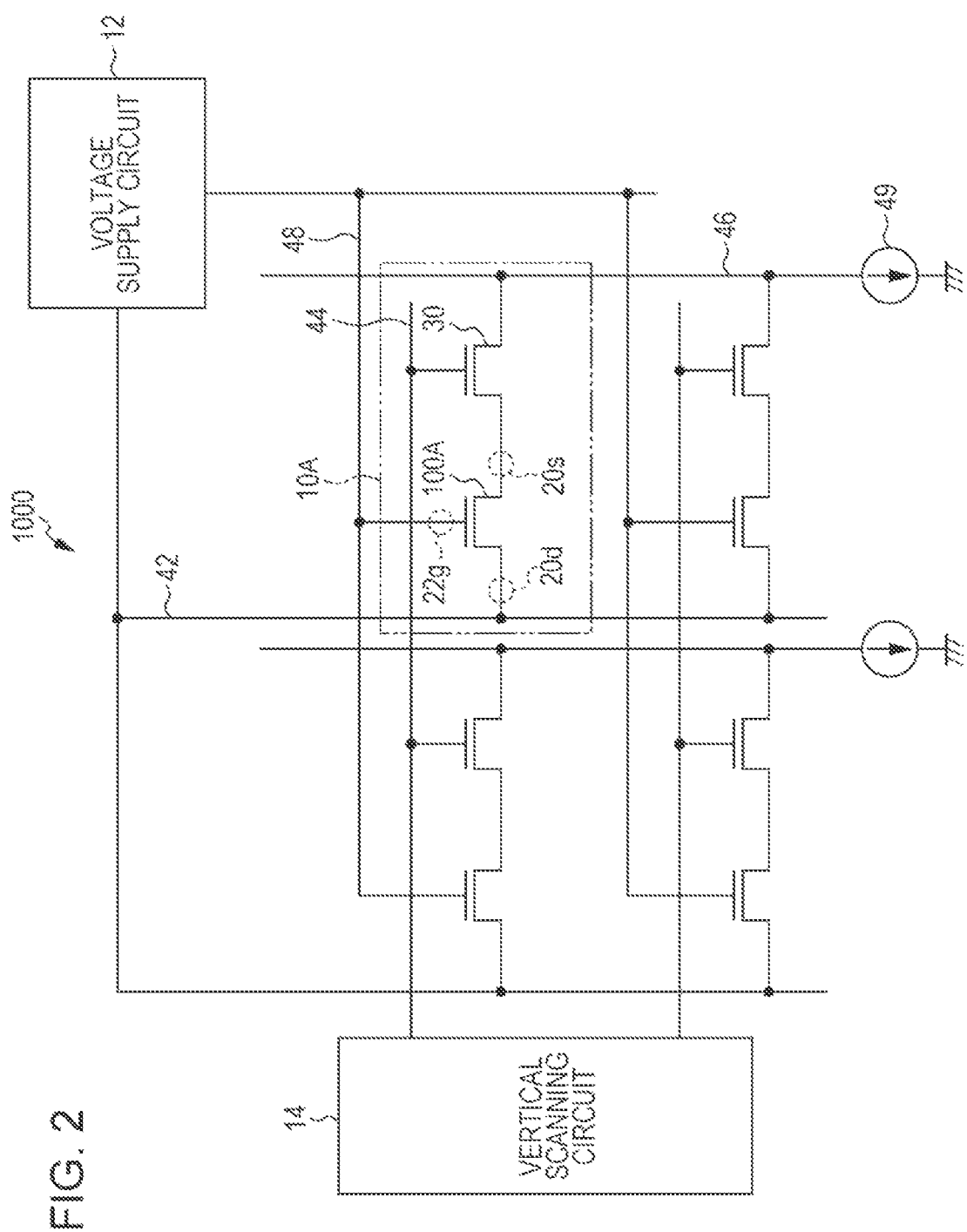
FIG. 2 is a schematic view illustrating an exemplary circuit configuration of the optical sensor.

FIG. 2 illustrates an exemplary circuit configuration of the optical sensor 1000. As described above, the photosensor 100A has a similar device structure to that of a field effect transistor. For that reason, the photosensor 100A is conveniently expressed here using similar circuit symbols to those used for a transistor.

FIG. 2 schematically illustrates an example in which the unit pixel cells 10A are arrayed in a matrix pattern of two rows and two columns. In this specification, directions in which a row and a column extend are called respectively a row direction and a column direction in some cases. As a matter of course, the number and the layout of the unit pixel cells in the optical sensor 1000 are not limited to those illustrated in the example of FIG. 2. The unit pixel cells may be arrayed one-dimensionally. In such a case, the optical sensor 1000 serves as a line sensor. The number of the unit pixel cells included in the optical sensor 1000 may be two or more, or may be one.

As described before, the impurity region 20*d* (which may be called the drain of the capacitance-modulated transistor) in the photosensor 100A of each unit pixel cell 10A is connected to the power supply wiring line 42. In the example illustrated in FIG. 2, the power supply wiring lines 42 are arranged in a one-to-one relation to the columns of the photosensor array. Those power supply wiring lines 42 are connected to a voltage supply circuit 12. During the operation of the optical sensor 1000, the voltage supply circuit 12 supplies the predetermined voltage (first bias voltage) to each of the unit pixel cells 10A, which constitute the photosensor array, through the power supply wiring line 42.

The transparent gate electrode 22*g* in the photosensor 100A of each unit pixel cell 10A is connected to a gate voltage control line 48. In the configuration illustrated in FIG. 2, the gate voltage control line 48 is connected to the voltage supply circuit 12. Thus, during the operation of the optical sensor 1000, the predetermined gate voltage (second bias voltage) is applied to the transparent gate electrode 22*g* of each photosensor 100A in the photosensor array from the voltage supply circuit 12 through the gate voltage control line 48. The voltage supply circuit 12 is not limited to a particular power supply circuit, and it may be a circuit for generating a predetermined voltage, or a circuit for converting a voltage supplied from another power supply to a predetermined voltage. As described later, the gate voltage within a predetermined range with a potential in the impurity region 20*d* of the photosensor 100A being a reference is applied to the transparent gate electrode 22*g* of each photosensor 100A.

In the configuration illustrated in FIG. 2, the address control line 44 connected to the gate of the address transistor 30 is connected to a vertical scanning circuit (also called a "row scanning circuit") 14. The vertical scanning circuit 14 applies a predetermined voltage to the address control line 44, thereby selecting the plurality of unit pixel cells 10A, which are arranged in each row, in units of row. Thus, signals of the selected unit pixel cells 10A can be read out through the address transistor 30.

As illustrated in the drawing, one (typically the drain) of the source and the drain of the address transistor 30 is connected to the impurity region 20*s* (which may also be called the source of the capacitance-modulated transistor) in the photosensor 100A, and the other (the source in this embodiment) of the source and the drain of the address transistor 30 is connected to the vertical signal line 46 that is disposed for each column of the photosensor array. The vertical signal line 46 is a main signal line through which pixel signals are transmitted from the photosensor array to a peripheral circuit.

In the illustrated example, a constant-current source 49 is connected between the vertical signal line 46 and a ground. Accordingly, a change of the threshold in the photosensor 100A, the change being attributable to the light irradiation of the photosensor 100A, can be detected by detecting a voltage change in the vertical signal line 46. Stated in another way, the light can be detected in accordance with the voltage change in the vertical signal line 46. On that occasion, the power supply wiring line 42 functions as a source follower power supply. The light may be detected by detecting a current that is output from the impurity region 20*s* of the photosensor 100A. However, it is more advantageous to detect the voltage change from the viewpoint that a similar process and circuit to those utilized for a photosensor using a silicon photodiode can be applied, and that a higher S/N ratio can be obtained.

A circuit for supplying the predetermined voltage to the impurity region 20*d* in the photosensor 100A and a circuit for supplying the predetermined voltage to the transparent gate electrode 22*g* may be one common circuit as illustrated in FIG. 2, or may be different from each other. At least one of the circuit for supplying the predetermined voltage to the impurity region 20*d* in the photosensor 100A and the circuit for supplying the predetermined voltage to the transparent gate electrode 22*g* may be part of the vertical scanning circuit 14.

Photoelectric Conversion Layer

A typical example of configuration of the photoelectric conversion layer 23*p* will be described in detail below.

A semiconductor material is typically used to constitute the photoelectric conversion layer 23*p*. Upon receiving the irradiation light, the photoelectric conversion layer 23*p* generates pairs of positive and negative charges (typically electron-hole pairs) therein. In this embodiment, an organic semiconductor material is used to constitute the photoelectric conversion layer 23*p*. The photoelectric conversion layer 23*p* contains, for example, tin naphthalocyanine expressed by the following general formula (1) (hereinafter simply called "tin naphthalocyanine" in some cases).

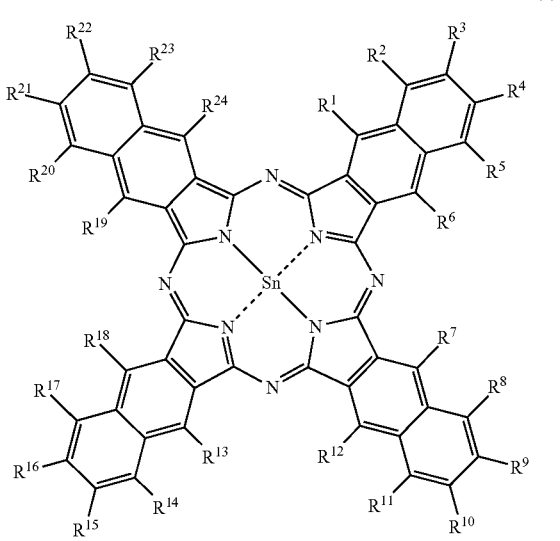

(1)

In the above general formula (1), $R^1$ to $R^{24}$ denote hydrogen atoms or substituents independently of one another. The substituents are not limited to particular ones. The substituents may be a deuterium atom, a halogen atom, alkyl groups (including a cycloalkyl group, a bicycloalkyl group, and a tricycloalkyl group), alkenyl groups (including a cycloalkenyl group and a bicycloalkenyl group), an alkynyl group, an aryl group, a heterocyclic group (also called a heterocyclic ring group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxy carbonyloxy group, amino groups (including an anilino group), an ammonio group, an acylamino group, an aminocarbonyl amino group, an alkoxycarbonyl amino group, an aryloxycarbonyl amino group, a sulfamoylamino group, an alkylsulfonyl amino group, an arylsulfonyl amino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxy carbonyl group, an alkoxycarbonyl group, a carbamoyl group, an arylazo group, a heterocyclic azo group, an imide group, a phosphino group, a phosphinyl group, a phosphinyloxy group, a phosphinylamino group, a phosphono group, a silyl group, a hydrazino group, a ureido group, a borate group (—$B(OH)_2$), a phosfato group (—$OPO(OH)_2$), a sulfato group (—$OSO_3H$), and other known substituents.

The tin naphthalocyanine expressed by the above general formula (1) may be a commercially available product. Alternatively, the tin naphthalocyanine expressed by the above general formula (1) can be synthesized using, as a starting material, a naphthalene derivative that is expressed by the following general formula (2), as set forth in Japanese Unexamined Patent Application Publication No. 2010-232410, for example. $R^{25}$ to $R^{30}$ in the general formula (2) may be substituents similar to those used as $R^1$ to $R^{24}$ in the general formula (1).

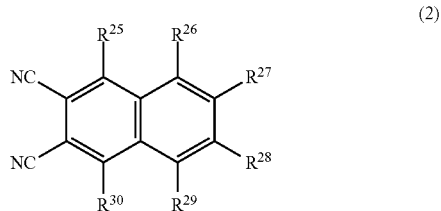

(2)

In the tin naphthalocyanine expressed by the above general formula (1), it is desirable, from the viewpoint of easiness in control of a molecular aggregation state, that eight or more among $R^1$ to $R^{24}$ are hydrogen atoms or deuterium atoms. More desirably, sixteen or more among $R^1$ to $R^{24}$ are hydrogen atoms or deuterium atoms. Even more desirably, all of $R^1$ to $R^{24}$ are hydrogen atoms or deuterium atoms. Additionally, tin naphthalocyanine expressed by the following general formula (3) is advantageous from the viewpoint of easiness in synthesis.

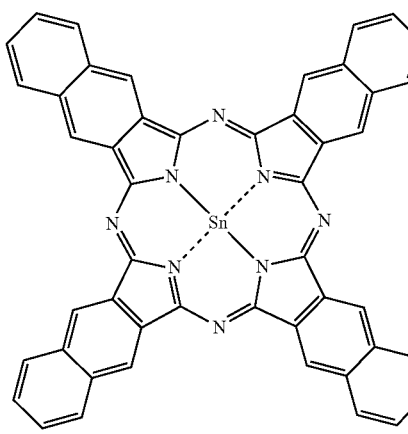

(3)

Figure 3:
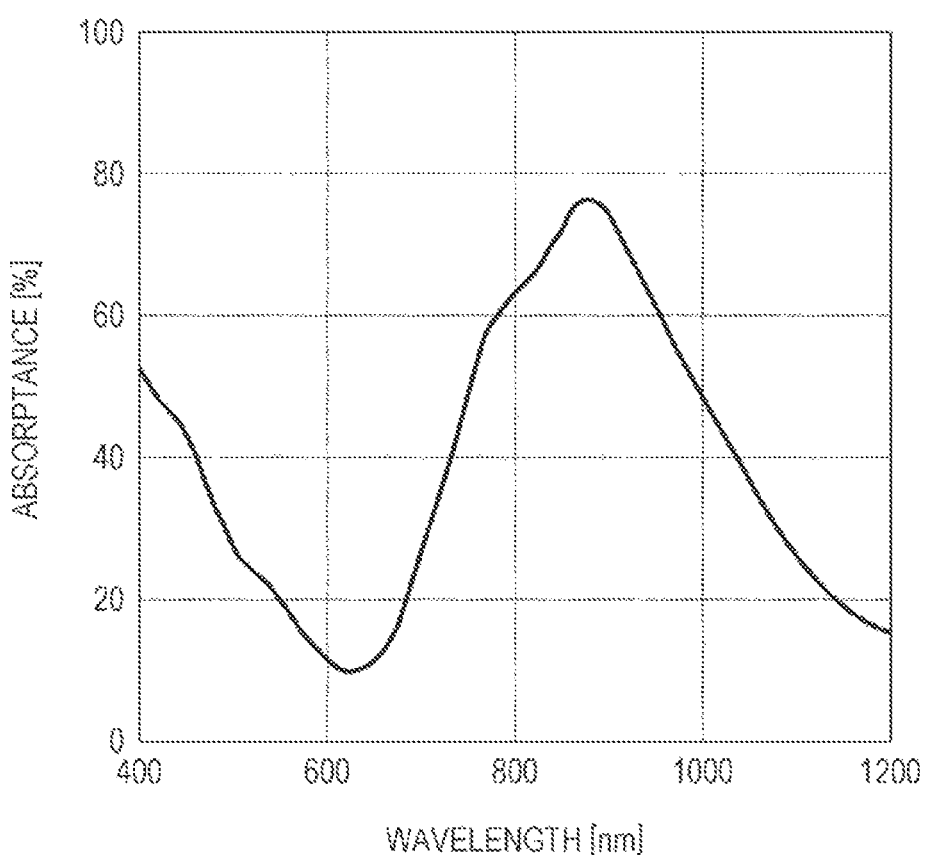
FIG. 3 is a graph depicting one example of an absorption spectrum in a photoelectric conversion layer that is formed of a material containing tin naphthalocyanine.

The tin naphthalocyanine expressed by the above general formula (1) exhibits absorption in a wavelength band of about 200 nm or more and about 1100 nm or less. The tin naphthalocyanine expressed by the above general formula (3), for example, has an absorption peak at the wavelength of about 870 nm as depicted in FIG. 3. FIG. 3 depicts one example of an absorption spectrum of a photoelectric conversion layer containing the tin naphthalocyanine expressed by the above general formula (3). A sample including the photoelectric conversion layer (thickness: 30 nm) laminated on a quartz substrate is used in measurement of the absorption spectrum.

As seen from FIG. 3, the photoelectric conversion layer formed of a material containing the tin naphthalocyanine exhibits absorption in a near-infrared region. In other words, an optical sensor capable of detecting near-infrared rays can be realized by selecting, as a material constituting the photoelectric conversion layer 23p, a material containing the tin naphthalocyanine.

Figure 4:
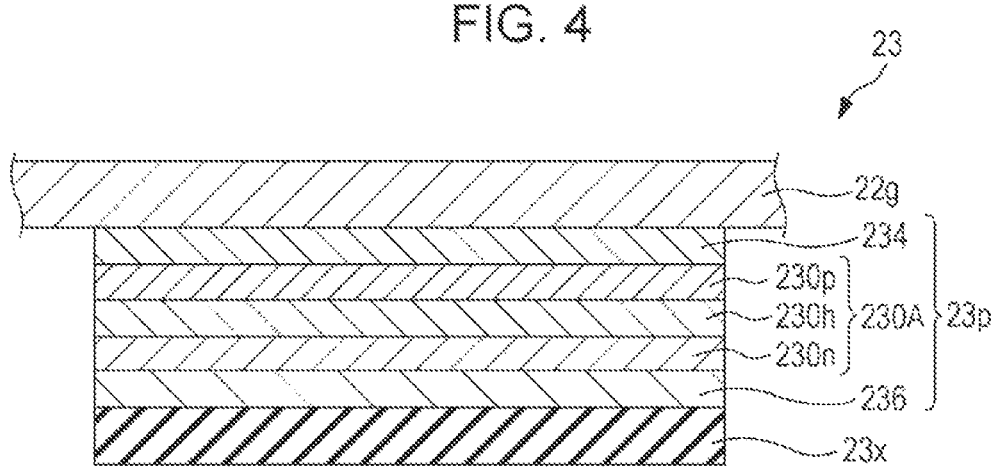
FIG. 4 is a schematic sectional view illustrating an example of a gate insulating layer including a photoelectric conversion layer that is formed of an organic semiconductor material containing tin naphthalocyanine expressed by a general formula (1)

FIG. 4 illustrates one example of the gate insulating layer including the photoelectric conversion layer that is formed using an organic semiconductor layer containing the tin naphthalocyanine expressed by the above general formula (1). In a configuration illustrated in FIG. 4, the gate insulating layer 23 includes a photoelectric conversion structure 230A. The gate insulating layer 23 further includes an electron blocking layer 234 that is disposed between the photoelectric conversion structure 230A and the transparent gate electrode 22g, and a hole blocking layer 236 that is disposed between the photoelectric conversion structure 230A and the insulating layer 23x.

The photoelectric conversion structure 230A includes at least one of a p-type semiconductor and an n-type semiconductor. In the configuration illustrated in FIG. 4, the photoelectric conversion structure 230A includes a p-type semiconductor layer 230p, an n-type semiconductor layer 230n, and a mixed layer 230h sandwiched between the p-type semiconductor layer 230p and the n-type semiconductor layer 230n. The p-type semiconductor layer 230p is disposed between the electron blocking layer 234 and the mixed layer 230h, and it has the functions of photoelectric conversion and/or hole transport. The n-type semiconductor layer 230n is disposed between the hole blocking layer 236 and the mixed layer 230h, and it has the functions of photoelectric conversion and/or electron transport. As described later, the mixed layer 230h may include at least one of a p-type semiconductor and an n-type semiconductor.

The p-type semiconductor layer 230p includes an organic p-type semiconductor, and the n-type semiconductor layer 230n includes an organic n-type semiconductor. Stated in another way, the photoelectric conversion structure 230A includes an organic photoelectric conversion material containing the tin naphthalocyanine expressed by the above general formula (1), and at least one of an organic p-type semiconductor and an organic n-type semiconductor.

The organic p-type semiconductor (compound) implies a donor organic semiconductor (compound), i.e., an organic compound that has electron-donating properties, and that is mainly represented by a hole transport organic compound. More specifically, when two organic materials are used in a contact state, one of those two organic compounds, which exhibits a smaller ionization potential, is called the organic p-type semiconductor (compound). Thus, any type of organic compound can be used as the donor organic compound insofar as it is an organic compound with electron-donating properties. Examples of that type of organic compound include a triarylamine compound, a benzidine compound, a pyrazoline compound, a styryl amine compound, a hydrazone compound, a triphenylmethane compound, a carbazole compound, a polysilane compound, a thiophene compound such as P3HT, a phthalocyanine compound such as copper phthalocyanine, a cyanine compound, a merocyanine compound, an oxonol compound, a polyamine compound, an indole compound, a pyrrole compound, a pyrazole compound, a polyarylene compound, condensed aromatic carboncyclic compounds (such as a naphthalene derivative, an anthracene derivative, a phenanthrene derivative, a tetracene derivative, a pyrene derivative, a perylene derivative, and a fluoranthene derivative), and a metal complex having a nitrogen-containing heterocyclic compound as a ligand. The donor organic semiconductor is not limited to the above-mentioned examples. As described above, the donor organic semiconductor may be any type of organic compound having a smaller ionization potential than an organic compound that is used as the n-type (acceptor) compound. The above-mentioned tin naphthalocyanine is one example of the organic p-type semiconductor material.

The organic n-type semiconductor (compound) implies an acceptor organic semiconductor (compound), i.e., an organic compound that has electron-accepting properties, and that is mainly represented by an electron transport organic compound. More specifically, when two organic materials are used in a contact state, one of those two organic compounds, which exhibits a larger electron affinity, is called the organic n-type semiconductor (compound). Thus, any type of organic compound can be used as the acceptor organic compound insofar as it is an organic compound with electron-accepting properties. Examples of that type of organic compound include fullerene, fullerene derivatives such as phenyl $C_{61}$ butyric acid methyl ester (PCBM), condensed aromatic carboncyclic compounds (such as a naphthalene derivative, an anthracene derivative, a phenanthrene derivative, a tetracene derivative, a pyrene derivative, a perylene derivative, and a fluoranthene derivative), five- to seven-membered heterocyclic compounds containing a nitrogen atom, an oxygen atom, and a sulfur atom (such as pyridine, pyradine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolopyridine, thiadiazolopyridine, dibenzazepine, and tribenzazepine), a polyarylene compound, a fluorene compound, a cyclopentadiene compound, a silyl compound, a perylenetetracarboxylic diimide compound (PTCDI), and a metal complex having a nitrogen-containing heterocyclic compound as a ligand. The acceptor organic semiconductor is not limited to the above-mentioned examples. As described above, the acceptor organic semiconductor may be any type of organic compound having a larger electron affinity than an organic compound that is used as the p-type (donor) organic compound.

The mixed layer 230h may be, for example, a bulk heterojunction structure layer including a p-type semiconductor and an n-type semiconductor. When the mixed layer 230h is formed as a layer having the bulk heterojunction structure, the tin naphthalocyanine expressed by the above general formula (1) can be used as the p-type semiconductor material. Fullerene and/or a fullerene derivative, for example, can be used as the n-type semiconductor material. It is desirable that the material constituting the p-type semiconductor layer 230p is the same as the p-type semiconductor material contained in the mixed layer 230h. Similarly, it is desirable that the material constituting the n-type semiconductor layer 230n is the same as the n-type semiconductor material contained in the mixed layer 230h. The bulk heterojunction structure is described in detail in Japanese Patent No. 5553727. For reference, the entire contents of Japanese Patent No. 5553727 are assumed to be incorporated in this specification.

A photosensor having sensitivity in a desired wavelength range can be realized by employing a proper material depending on the wavelength range to be detected. The photoelectric conversion layer 23p may include an inorganic semiconductor material, such as amorphous silicon, without being limited to the organic semiconductor material. The photoelectric conversion layer 23p may include a layer made of an organic material and a layer made of an inorganic material. The following description is made in connection with an example in which the bulk heterojunction structure obtained by co-evaporation of the tin naphthalocyanine and $C_{60}$ is employed in the photoelectric conversion layer 23p.

Photocurrent Characteristics in Photoelectric Conversion Layer

Figure 5:
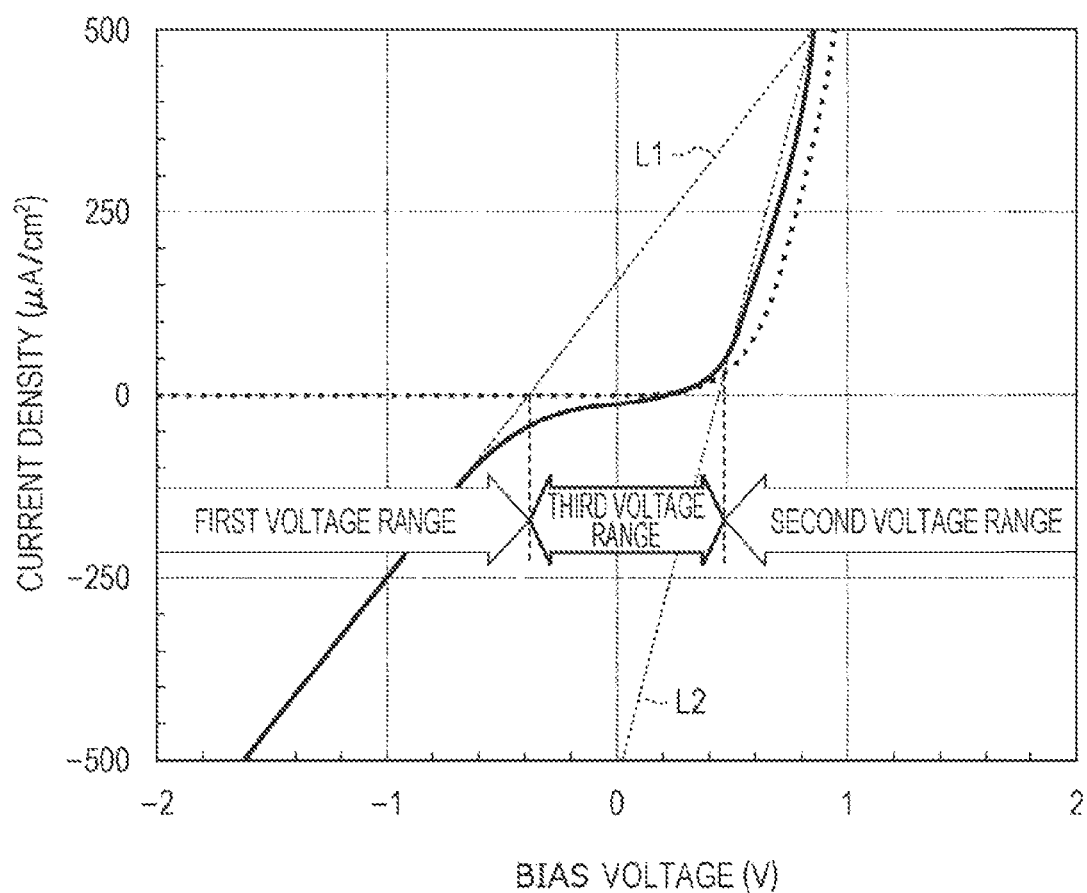
FIG. 5 is a graph depicting a typical example of photocurrent characteristics in the photoelectric conversion layer.

FIG. 5 depicts a typical example of photocurrent characteristics in the photoelectric conversion layer 23p. In FIG. 5, a graph denoted by a thick solid line represents, by way of example, current-voltage characteristics (I-V characteristics) of the photoelectric conversion layer 23p in a state where the photoelectric conversion layer is irradiated with light. One example of I-V characteristics in a state where the photoelectric conversion layer is not irradiated with light is also represented by a thick dotted line in FIG. 5.

FIG. 5 depicts changes of a current density between two principal surfaces of the photoelectric conversion layer when a bias voltage applied to those two principal surfaces is changed under constant illuminance. In this specification, a forward direction and a reverse direction of the bias voltage are defined as follows. When the photoelectric conversion layer has a junction structure made up of a p-type semiconductor in the form of a layer and an n-type semiconductor in the form of a layer, a bias voltage providing a higher potential in the layer of the p-type semiconductor than in the layer of the n-type semiconductor is defined as the bias voltage in the forward direction. On the other hand, a bias voltage providing a lower potential in the layer of the p-type semiconductor than in the layer of the n-type semiconductor is defined as the bias voltage in the reverse direction. In the case of employing organic semiconductor materials, the forward direction and the reverse direction can be defined as in the case of employing inorganic semiconductor materials. When the photoelectric conversion layer has the bulk heterojunction structure, as schematically illustrated in FIG. 1 in the above-cited Japanese Patent No. 5553727, the p-type semiconductor appears in one of the two principal surfaces of the photoelectric conversion layer at a larger proportion than the n-type semiconductor, and the n-type semiconductor appears in the other principal surface of the photoelectric conversion layer at a larger proportion than the p-type semiconductor. Accordingly, a bias voltage providing a potential on the side near the principal surface where the p-type semiconductor appears at a larger proportion than the n-type semiconductor, the potential being higher than that on the side near the principal surface where the n-type semiconductor appears at a larger proportion than the p-type semiconductor, is defined as the bias voltage in the forward direction.

As depicted in FIG. 5, the photocurrent characteristics in the photoelectric conversion layer according to the embodiment of the present disclosure are roughly featured by three, i.e., first to third, voltage ranges. The first voltage range represents a reverse-bias voltage range where an absolute value of an output current density increases as the bias voltage in the reverse direction increases. Thus, the first voltage range may be called a voltage range where a photocurrent increases as the bias voltage applied between the principal surfaces of the photoelectric conversion layer increases. The second voltage range represents a forward-bias voltage range where the output current density increases as the bias voltage in the forward direction increases. Thus, the second voltage range is a voltage range where a current in the forward direction increases as the bias voltage applied between the principal surfaces of the photoelectric conversion layer increases. The third voltage range is a voltage range between the first voltage range and the second voltage range.

The first to third voltage ranges can be discriminated in accordance with a gradient of the graph representing the photocurrent characteristics when the vertical axis and the horizontal axis are each expressed in a linear scale. For reference, in FIG. 5, an average gradient of the graph in the first voltage range is denoted by a dotted line L1, and an average gradient of the graph in the second voltage range is denoted by a dotted line L2. As depicted in FIG. 5, by way of example, a rate of change of the output current density relative to an increase of the bias voltage is different among the first voltage range, the second voltage range, and the third voltage range. The third voltage range is defined as a voltage range where the rate of change of the absolute value of the output current density relative to the bias voltage is smaller than the rate of change in the first voltage range and the rate of change in the second voltage range. As an alternative, the third voltage range may be determined on the basis of a position of rising (falling) in the graph that represents the I-V characteristics. Typically, the third voltage range is entirely larger than −1 V and entirely smaller than +1 V. In the third voltage range, the current density between the principal surfaces of the photoelectric conversion layer is hardly changed even when the bias voltage is changed. As depicted in FIG. 5, by way of example, the absolute value of the current density in the third voltage range is typically not more than 100 $\mu A/cm^2$. In the third voltage range, as described in detail later, the pairs of the positive and negative charges (i.e., the hole-electron pairs) generated with the light irradiation promptly recombine and disappear upon stop of the light irradiation. Therefore, a high-speed response can be realized by adjusting the bias voltage, which is applied between the two principal surfaces of the photoelectric conversion layer during the operation of the optical sensor, to the voltage within the third voltage range.

Referring to FIGS. 1 and 2 again, in the typical embodiment of the present disclosure, the detection of the light is performed in a state where a potential difference between one of the two impurity regions of the photosensor, the one being connected to the power supply wiring line 42, and the transparent gate electrode 22g is maintained within the above-mentioned third voltage range during the operation of the optical sensor. In the configuration described with reference to FIG. 2, by way of example, the gate voltage with the impurity region 20d being a reference falling within the third voltage range is supplied to the transparent gate electrode 22g from the voltage supply circuit 12. In the operation of detecting the light, therefore, the photoelectric conversion layer 23p is in a state where the bias voltage within the third voltage range is applied between its upper surface (i.e., a principal surface on the side close to the transparent gate electrode 22g) and its lower surface.

With incidence of the light upon the photoelectric conversion layer 23p, hole-electron pairs, for example, are generated inside the photoelectric conversion layer 23p. At that time, because the predetermined bias voltage is applied to the photoelectric conversion layer 23p, respective dipole moments of the hole-electron pairs are oriented almost uniformly in the same direction. Therefore, the dielectric constant of the photoelectric conversion layer 23p increases with the generation of the hole-electron pairs. On an assumption that E denotes the magnitude of an electric field within the photoelectric conversion layer 23p in a state applied with the predetermined bias voltage and is irradiated with the light, $E=((\sigma_f-\sigma_p)/\varepsilon_0)$ and $E=(\sigma_f/\varepsilon)$ are held on the basis of Gauss's law. Here, $\sigma_f$ denotes a charge density in an electrode (e.g., the transparent gate electrode 22g), and $\sigma_p$ denotes a density of charges generated due to polarization in a surface of the photoelectric conversion layer 23p, the surface being opposed to the electrode. Furthermore, $\varepsilon_0$ and $\varepsilon$ denote respectively the dielectric constant of vacuum and the dielectric constant of the photoelectric conversion layer 23p. From $E=((\sigma_f-\sigma_p)/\varepsilon_0)$ and $E=(\sigma_f/\varepsilon)$, $\varepsilon=\varepsilon_0(\sigma_f/(\sigma_f-\sigma_p))$ is obtained. Thus, it is understood that the dielectric constant of the photoelectric conversion layer 23p increases with an increase of charges (hole-electron pairs) that contribute to the polarization. In other words, the overall dielectric constant of the gate insulating layer 23 increases with the light irradiation of the photoelectric conversion layer 23p.

Assuming here the photosensor 100A to be a transistor, with an increase of the dielectric constant of the gate insulating layer 23, a threshold voltage is reduced (this can also be said that an effective gate voltage is increased). Thus, a voltage in the impurity region 20s is changed due to a change of the dielectric constant of the gate insulating layer 23 with a source follower configuration. Stated in another way, a source voltage of the transistor, which is assumed in place of the photosensor 100A, is changed depending on a change of the illuminance applied to the photosensor 100A. Accordingly, the light can be detected by detecting the change of the source voltage with an appropriate detection circuit.

By connecting the constant-current source 49 to the vertical signal line 46 as illustrated in FIG. 2, for example, and by turning on the address transistor 30, the change of the threshold voltage depending on the change of the illuminance applied to the photosensor 100A can be detected as a voltage change in the vertical signal line 46. Alternatively, a constant-voltage source may be connected to the vertical signal line 46, and a current change in the vertical signal line 46 may be detected. Thus, an output signal from the photosensor 100A may be given as a voltage change or a current change.

A point to be noted here is that the bias voltage within the third voltage range is applied to the photoelectric conversion layer 23p during the detection of the light. In a related-art photosensor utilizing a photodiode (or a photoelectric conversion film), an operation of detecting light is generally performed under application of a reverse bias, which corresponds to the first voltage range illustrated in FIG. 5. Therefore, holes and electrons generated with the photoelectric conversion drift respectively toward a cathode and an anode of the photodiode. Thus, in the detection of the light by the related-art photosensor utilizing the photodiode (or the photoelectric conversion film), charges generated with the photoelectric conversion are taken out as a signal to an external circuit.

On the other hand, in the typical example of the optical sensor according to the present disclosure, the bias voltage within the third voltage range is applied to the photoelectric conversion layer 23p during the detection of the light. When the photoelectric conversion layer 23p is irradiated with the light in the state where the bias voltage within the third voltage range is applied, hole-electron pairs, for example, are generated in the photoelectric conversion layer 23p. In the state where the bias voltage within the third voltage range is applied, however, the generated holes and electrons form dipoles without separating from each other and drifting to the electrodes. In other words, the generated holes and electrons are not taken out to the outside of the photoelectric conversion layer 23p.

Respective speeds of outflow of charges from the photoelectric conversion layer and inflow of charges into the photoelectric conversion layer are slow (about several tens milliseconds). Accordingly, when the photosensor is applied to an image sensor, the configuration accompanying with the outflow of charges from the photoelectric conversion layer or the inflow of charges into the photoelectric conversion layer gives rise to a possibility of causing noise, a residual image, etc. with application of the voltage to the photoelectric conversion layer and the light irradiation at the start of image-taking, etc. On the other hand, with the configuration of setting the bias voltage applied to the photoelectric conversion layer 23p to the voltage within the third voltage range during the detection of the light, the occurrence of noise, a residual image, etc. can be suppressed because of not accompanying with the outflow of charges from the photoelectric conversion layer or the inflow of charges into the photoelectric conversion layer.

Furthermore, in the state where the bias voltage within the third voltage range is applied, the hole-electron pairs recombine and disappear promptly (not longer than several tens microseconds) when the incidence of the light upon the photoelectric conversion layer 23p is stopped. Hence a high-speed response can be realized with the embodiment of the present disclosure. Since the high-speed response is realized, the photosensor according to the embodiment of the present disclosure can be advantageously applied to range sensing with the time-of-flight method, ultra-high-speed image taking, etc. The first bias voltage applied to the impurity region 20d through the power supply wiring line 42 is 2.4 V, for example, and the second voltage applied to the transparent gate electrode 22g through the gate voltage control line 48 is 2.5 V, for example. Thus, in the example described here, a potential difference of about 0.1 V is applied between the upper and lower surfaces of the gate insulating layer 23 in the photosensor 100A. As described later, the detection of the light can also be performed by applying the bias voltage within the first voltage range to the photoelectric conversion layer.

Detection of Infrared Rays

A photoelectric conversion material exhibiting absorption in an infrared region has a narrow bandgap. Activation energy in a current attributable to thermal excitation, the current causing a dark current, is proportional to the bandgap. Accordingly, when the photoelectric conversion material exhibiting absorption in the infrared region is used as a material of the gate insulating layer of the capacitance-modulated transistor, there is a possibility that a sufficient S/N ratio cannot be ensured with generation of a gate leak. The magnitude of a leak current in an organic photoelectric conversion layer alone under application of a bias voltage of 0.1 V is, for example, about $1 \times 10^{-8}$ A/cm$^2$ (where "×" denotes multiplication).

In the example described here, a photoelectric conversion layer exhibiting absorption in a near infrared region is used as the photoelectric conversion layer 23p. In the configuration illustrated in FIG. 1, the insulating layer 23x is disposed between the photoelectric conversion layer 23p and the semiconductor substrate 20. With the provision of the insulating layer 23x between the photoelectric conversion layer 23p and the semiconductor substrate 20, a leak current in the photoelectric conversion layer 23p can be reduced, and a demanded S/N ratio can be ensured.

Figure 6:
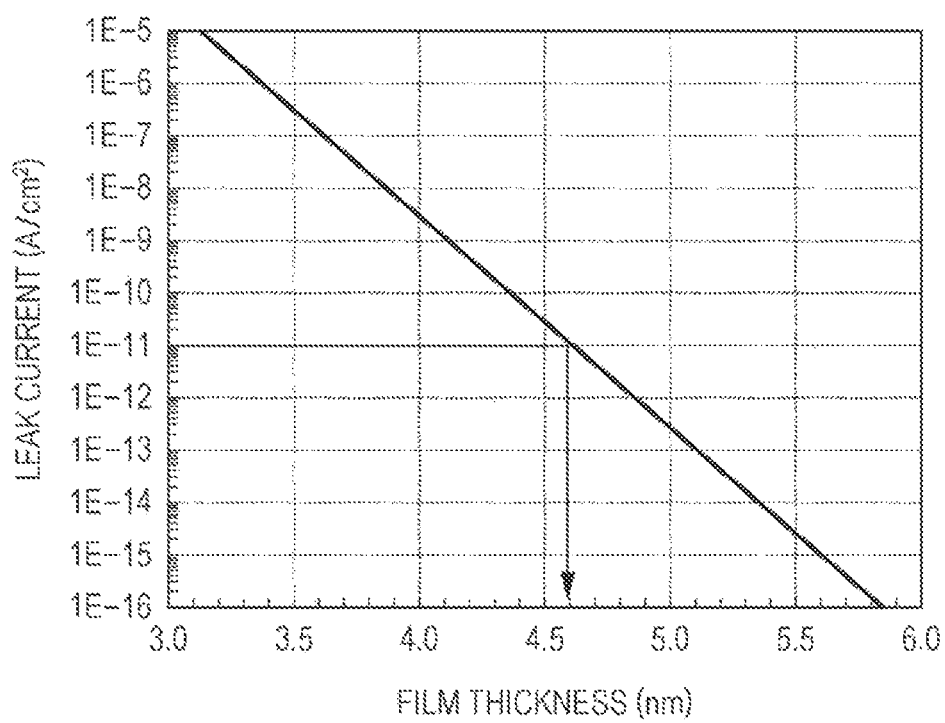
FIG. 6 is a graph depicting dependency, on a film thickness, of a leak current that flows in a thermal oxide film of silicon when a voltage of 0.1 V is applied.

A thermal oxide film of silicon, for example, may be used as the insulating layer 23x. FIG. 6 depicts dependency, on a film thickness, of a leak current that flows in the thermal oxide film of silicon when a voltage of 0.1 V is applied. In the optical detection method according to the embodiment of the present disclosure, it is advantageous, from the viewpoint of ensuring satisfactory characteristics in a state not under the light irradiation, that the leak current in the gate insulating layer 23 is not more than $1 \times 10^{-11}$ A/cm$^2$. The magnitude of the leak current at such a level corresponds to a leak amount of not more than 1 e/s on an assumption that an area (gate area) when looking at the gate insulating layer 23 from the normal direction of the semiconductor substrate 20 is 1 μm$^2$ ("e" as a unit of the leak amount denotes the number of electrons). As seen from FIG. 6, when the thermal oxide film of silicon is used as the insulating layer 23x, the leak current can be reduced to a demanded level by setting a thickness of the thermal oxide film to 4.6 nm or more.

In the case of utilizing the above-described third voltage range, the voltage applied between the upper surface and the lower surface of the photoelectric conversion layer 23p during the detection of the light is relatively small, namely about 0.1 V, for example. Therefore, it is relatively easy to use a material having a narrow bandgap as the material of the photoelectric conversion layer 23p. Furthermore, the leak current to the channel region of the capacitance-modulated transistor can be reduced with the provision of the insulating layer 23x between the photoelectric conversion layer 23p and the semiconductor substrate 20. In the case of utilizing the third voltage range, the potential difference applied between the impurity region 20d and the transparent gate electrode 22g is relatively small. Accordingly, an insulating film being relatively thin can be used as the insulating layer 23x, and information regarding the illuminance can be obtained, for example, in terms of modulation of the drain current.

According to the embodiment of the present disclosure, as described above, it is possible to suppress the dark current and to ensure a high S/N ratio in spite of using the photoelectric conversion material that exhibits absorption in the infrared region and that has a narrow bandgap. As a matter of course, the material constituting the insulating layer 23x is not limited to silicon dioxide. A silicon oxynitride film (SiON film), which is generally used in silicon semiconductors, may be used as the insulating layer 23x. A High-k film, such as a HfO$_2$ film, may also be used. The thickness of the insulating layer 23x may be set as appropriate depending on the material that is used to constitute the insulating layer 23x.

Imaging with use of near infrared rays has promise in the fields of, for example, a night vision system loaded on a vehicle and vital observation, and a photosensor having sensitivity in the infrared region is demanded. As well known, the band gap of silicon is 1.1 eV, and a photosensor using a silicon photodiode cannot detect light with a wavelength of 1100 nm or longer. Although the silicon photodiode has sensitivity in the wavelength range of about 900 nm, the sensitivity is lower than that in the wavelength range of visible light, and an improvement of performance is demanded particularly in applications to the night vision system.

$In_xGa_{1-x}As$ is known as a semiconductor having a narrow bandgap. The bandgap of $In_xGa_{1-x}As$ can be narrowed to 0.3 eV by adjusting a composition ratio X. A photosensor using $In_xGa_{1-x}As$ can be given with sensitivity for a wavelength of 3 μm at maximum, and hence the photosensor using $In_xGa_{1-x}As$ can be employed as an infrared sensor. However, the sensor needs to be cooled in order to suppress degradation of an S/N ratio, which is caused by the dark current attributable to crystal defects and by thermal noise attributable to the narrow bandgap. Accordingly, that type of sensor has a difficulty in reducing the size and the cost, and it has not yet been widely employed for consumer use. A microbolometer and a pyroelectric sensor are known as infrared sensors not using cooling devices. However, because the microbolometer and the pyroelectric sensor perform detection of infrared rays based on heat, a response speed is as slow as several ten milliseconds, and applications of those sensors are restricted.

According to the embodiment of the present disclosure, it is relatively easy to use, as the photoelectric conversion layer 23p, the material exhibiting absorption in the infrared region. For example, the photoelectric conversion layer containing the tin naphthalocyanine expressed by the above-mentioned formula (3) has an absorption peak in the wavelength range of 80 nm to 1000 nm, as depicted in FIG. 3. The quantum efficiency of the photoelectric conversion layer containing the tin naphthalocyanine expressed by the formula (3) at the wavelength of 900 nm may be about ten times that of silicon. Thus, according to the embodiment of the present disclosure, a photosensor or an optical sensor having sensitivity in the infrared region can be realized with a comparatively simple configuration. Since the detection performed by the optical sensor according to the embodiment of the present disclosure is not based on heat, generation of thermal noise attributable to temperature change in a channel portion can be avoided, and there is no need of providing a cooling mechanism.

The optical sensor 1000 can be manufactured by employing general semiconductor manufacturing processes. In particular, when a silicon substrate is used as the semiconductor substrate 20, the optical sensor 1000 can be manufactured by utilizing various silicon semiconductor processes. Since the photosensor according to the present disclosure has a similar device structure to that of a field effect transistor, it is also relatively easy to form other transistors and the photosensor according to the present disclosure on the same semiconductor substrate.

Modifications of Unit Pixel Cell

In the configurations described with reference to FIGS. 1 and 2, in the state of the address transistor 30 being turned on, the voltage in the impurity region 20s (which may also be called the source voltage of the capacitance-modulated transistor) is changed from moment to moment depending on a change of the illuminance applied to the photosensor 100A. In other words, a signal level read out through the vertical signal line 46 is given as a level corresponding to the illuminance applied to the photosensor 100A at the time of the reading-out. Thus, information regarding the illuminance can be obtained in real time.

As described above, a capacitor having one end electrically connected to the input stage of the signal detection circuit may be disposed in the unit pixel cell. For example, a capacitor having one electrode electrically connected to the impurity region 20s or 30s (see, e.g., FIG. 1) in the semiconductor substrate 20 may be disposed in the unit pixel cell. With the provision of such a capacitor in the unit pixel cell, the output signal can be read out at timing different from the timing of exposure of the photosensor.

Figure 7:
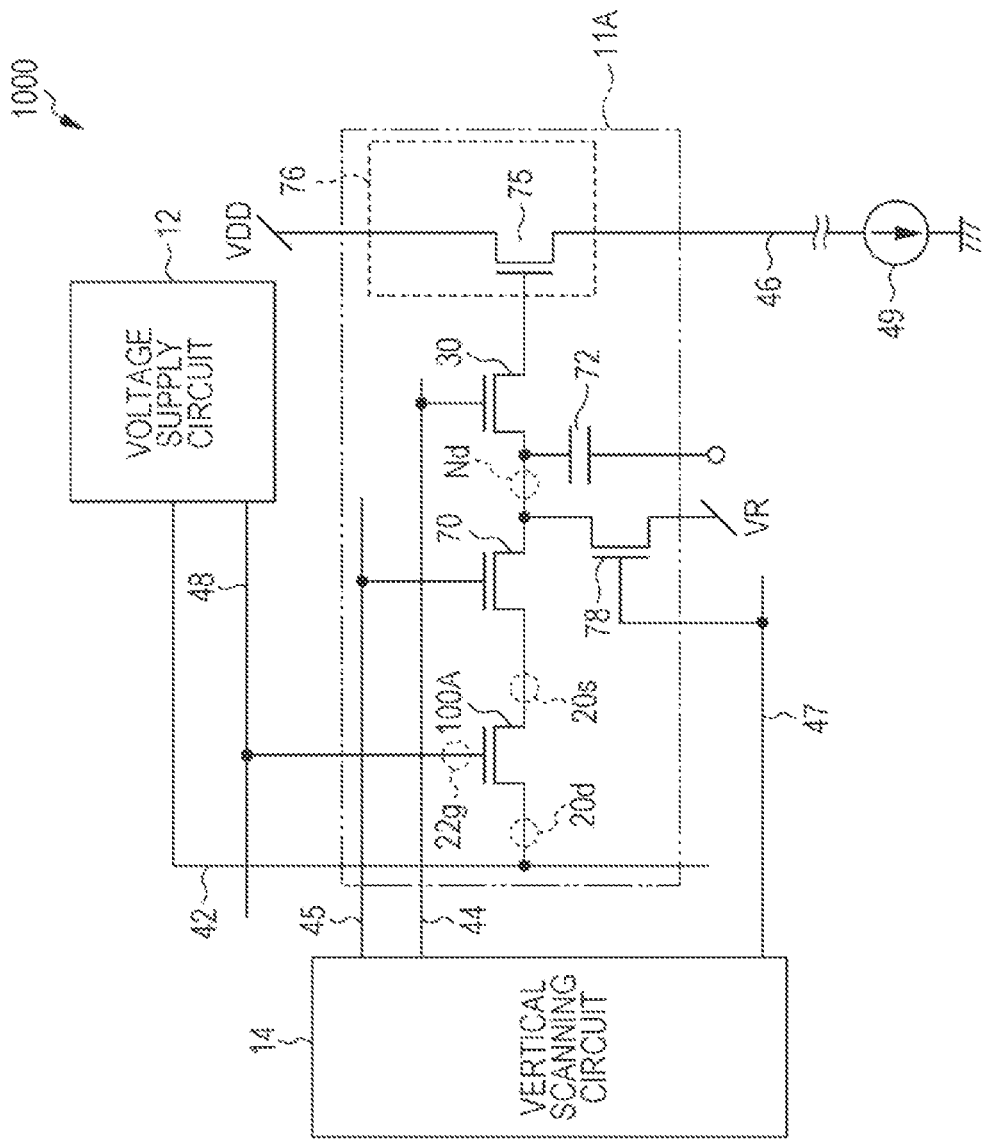
FIG. 7 is a schematic view illustrating another example of circuit configuration of a unit pixel cell, which can be applied to the optical sensor.

FIG. 7 illustrates another example of circuit configuration of the unit pixel cell, which can be applied to the optical sensor 1000. A unit pixel cell 11A illustrated in FIG. 7 mainly includes the above-described photosensor 100A, a signal detection circuit 76 connected to the vertical signal line 46, a transfer transistor 70 connected between the photosensor 100A and the signal detection circuit 76, and a capacitor 72 having one end electrically connected to an input of the signal detection circuit 76. Here, for the sake of avoiding the drawing from being complicated excessively, one unit pixel cell is taken out and a circuit configuration of the one unit pixel cell is schematically illustrated by way of example. When the optical sensor 1000 includes the plurality of unit pixel cells, each of the unit pixel cells may have a similar configuration to that of the illustrated circuit.

In the configuration illustrated in FIG. 7, the signal detection circuit 76 includes a signal detection transistor 75 having a source connected to the vertical signal line 46. The signal detection transistor 75 and the constant-current source 49 form a source follower circuit. During the operation of the optical sensor 1000, a power supply voltage VDD, for example, is supplied to a drain of the signal detection transistor 75. The signal detection transistor 75 amplifies a voltage applied to its gate and outputs the amplified voltage to the vertical signal line 46. In the illustrated example, the gate serves not only as an input of the signal detection transistor 75, but also as an input of the signal detection circuit 76.

The gate of the signal detection transistor 75 is indirectly electrically connected to the impurity region 20s in the photosensor 100A. In the illustrated example, the gate of the signal detection transistor 75 is connected to the impurity region 20s through both the transfer transistor 70 and the address transistor 30. One (e.g., a drain) of a drain and a source of the transfer transistor 70 is connected to the impurity region 20s, and one (e.g., a drain) of a drain and a source of the address transistor 30 is connected to the other of the drain and the source of the transfer transistor 70. The gate of the signal detection transistor 75 is connected to other of the drain and the source of the address transistor 30.

The one end of the capacitor 72 is connected to a node Nd between the transfer transistor 70 and the address transistor 30. During the operation of the optical sensor 1000, a predetermined voltage is applied to the other end of the capacitor 72 from a power supply, which is not illustrated in FIG. 7, whereby a potential at the other end is fixedly held. The potential at the other end of the capacitor 72 during the operation of the optical sensor 1000 is, for example, a ground potential.

The capacitor 72 may have a structure just capable of temporarily accumulating charges, and the structure of the capacitor 72 is not limited to particular one. The capacitor 72 may be formed, for example, in the form of a pn-junction inside the semiconductor substrate 20. Alternatively, the capacitor 72 may be formed as the so-called metal-insulator-semiconductor (MIS) capacitor including, as its part, an impurity region formed in the semiconductor substrate 20, or a capacitor having a metal-insulator-metal (MIM) structure in which a dielectric is sandwiched between two electrodes each made of a metal or a metal compound. As an alternative, the capacitor 72 may be a combination of the above-mentioned examples. The capacitor 72 may have a trench or stack structure. The capacitor of the MIM structure may be disposed, for example, inside the interlayer insulating layer 50. The "capacitor" used in this specification is not limited to a structure in which a dielectric is disposed between conductors, and it may have suitable one of various structures capable of accumulating charges.

As illustrated in the drawing, a transfer control line 45 is connected to a gate of the transfer transistor 70. The transfer control line 45 is disposed in units of row and extends along the row direction over the plurality of unit pixel cells 11A. In the illustrated example, the transfer control line 45 is connected to the vertical scanning circuit 14. Accordingly, the vertical scanning circuit 14 can control on/off of the transfer transistor 70 through the transfer control line 45 by applying a predetermined voltage to the transfer control line 45. When the transfer transistor 70 is turned on, charges in an amount corresponding to a potential difference between the drain and the source of the transfer transistor 70 are transferred to the capacitor 72 from the impurity region 20s.

In the typical embodiment of the present disclosure, the detection of the light is performed in the state where the potential difference between the impurity region 20d and the transparent gate electrode 22g is maintained within the third voltage range. At that time, the impurity region 20s outputs an electrical signal corresponding to a change of the dielectric constant of the gate insulating layer 23. As described above, the source voltage of the transistor that is assumed in place of the photosensor 100A, i.e., the potential in the impurity region 20s, is changed depending on a change of the illuminance applied to the photosensor 100A. Accordingly, when the transfer transistor 70 is turned on during a certain period in a state of the address transistor 30 being turned off, charges in an amount reflecting a quantity of the light incident upon the photosensor 100A during the certain period are transferred to the capacitor 72. Thereafter, when the address transistor 30 is turned on in a state of the transfer transistor 70 being turned off, a signal voltage corresponding to the amount of charges, which have been transferred through the transfer transistor 70 and accumulated in the capacitor 72, are read out to the vertical signal line 46. In other words, a signal voltage corresponding to the quantity of the incident light during the period in which the transfer transistor 70 has been kept turned on can be selectively read out at desired timing through the vertical signal line 46. Thus, with the circuit configuration illustrated in FIG. 7, the output signal can be read out at timing different from the timing of exposure of the photosensor 100A. The period during which the transfer transistor 70 has been kept turned on may be called a charge accumulation period.

A light detection operation of reading out an output signal corresponding to a quantity of incident light during a certain period can be applied to TOF range sensing, etc. For example, by repeating a cycle of irradiation of a range sensing target with pulse light and accumulation of signal charges in an amount corresponding to reflected light incident upon the photosensor 100A during a detection period of a certain length, it is possible to accumulate the signal charges for each detection period, and to obtain a sufficient signal level. When the plurality of unit pixel cells 11A are two-dimensionally arrayed, a range image can also be constructed using outputs from the individual unit pixel cells 11A. As another example, when the optical sensor 1000 includes the plurality of unit pixel cells 11A, the so-called global shutter operation in which timings of starting and ending accumulation of the signal charges are made coincident with each other among the plurality of unit pixel cells can be realized by setting the charge accumulation periods to be even among the plurality of unit pixel cells 11A.

In the example illustrated in FIG. 7, the unit pixel cell 11A includes a reset transistor 78 that is connected at one of a drain and a source thereof to the node Nd. The other of the drain and the source of the reset transistor 78 is connected to a not-illustrated power supply, for example, and is supplied with a predetermined reset voltage VR during the operation of the optical sensor 1000. A gate of the reset transistor 78 is connected to a reset control line 47. In the illustrated example, the reset control line 47 is connected to the vertical scanning circuit 14. The reset control line 47 is disposed in units of row and extends along the row direction over the plurality of unit pixel cells 11A.

When the transfer transistor 70 and the address transistor 30 are turned off and the reset transistor 78 is turned on, the charges accumulated in the capacitor 72 can be purged through the node Nd. In other words, by turning on the reset transistor 78, a voltage at the node Nd is set to the predetermined reset voltage VR, whereby the charges accumulated in the capacitor 72 can be reset. With the provision of the reset transistor 78 in the unit pixel cell, a potential at the node Nd before transfer of the charges through the transfer transistor 70 can be set to a desired potential. The reset voltage VR may be the same as or different from the voltage (e.g., the ground voltage) that is applied to the end of the capacitor 72 on the side not connected to the node Nd.

The operation of detecting light is as follows, by way of example. First, the predetermined bias voltages are supplied to the power supply wiring line 42 and the gate voltage control line 48 from the voltage supply circuit 12 such that the potential difference between the impurity region 20d of the photosensor 100A and the transparent gate electrode 22g is held within the predetermined range. The transfer transistor 70 and the address transistor 30 are turned off, and the reset transistor 78 is turned on. With the turning-on of the reset transistor 78, the potential at the node Nd is reset. After resetting the potential at the node Nd, the reset transistor 78 is turned off.

After turning off the reset transistor 78, the address transistor 30 may be turned on to read out a signal. In the following, a signal level obtained at this time is called a reset level.

Then, the transfer transistor 70 is turned on at desired timing, and the transfer transistor 70 is turned off after the lapse of a desired time. With such an operation, charges in an amount reflecting a quantity of light incident upon the photosensor 100A during a period in which the transfer transistor 70 has been kept turned on is transferred to the capacitor 72. After the transfer of the charges to the capacitor 72, the address transistor 30 is turned on to read out the signal. A signal from which fixed noise has been removed is obtained by determining a differential between a level of the signal read out at that time and the reset level (correlated double sampling).

FIGS. 8 to 12 illustrate other examples of circuit configuration of the unit pixel cell, which can be applied to the optical sensor 1000. In the configuration illustrated in FIG. 8, the signal detection circuit 76 includes two or more signal detection transistors. In the illustrated example, the signal detection circuit 76 in a unit pixel cell 13A includes not only a signal detection transistor 75a, but also a second signal detection transistor 75b. The signal detection transistor 75a and the signal detection transistor 75b are connected in parallel between the power supply line to which the power supply voltage VDD is applied and the vertical signal line 46. In the illustrated example, sources of the signal detection transistors 75a and 75b are connected respectively to the vertical signal lines 46a and 46b.

As in the example described above with reference to FIG. 7, a gate of the signal detection transistor 75a is indirectly electrically connected to the impurity region 20s in the photosensor 100A. A transfer transistor 70a and an address transistor 30a are connected between the gate of the signal detection transistor 75a and the impurity region 20s. A transfer control line 45a and an address control line 44a are connected respectively to a gate of the transfer transistor 70a and a gate of the address transistor 30a. In the illustrated example, the transfer control line 45a and the address control line 44a are connected to the vertical scanning circuit 14. One end of a capacitor 72a is connected to a node between the transfer transistor 70a and the address transistor 30a.

As illustrated in the drawing, the unit pixel cell 13A further includes a second transfer transistor 70b, a second address transistor 30b, and a second capacitor 72b. The second transfer transistor 70b and the second address transistor 30b are connected in series between a gate of the signal detection transistor 75b and the impurity region 20s. One of a source and a drain of the second transfer transistor 70b is connected to a node between the impurity region 20s and the transfer transistor 70a. Stated in another way, the unit pixel cell 13A includes a node that is branched from the node between the impurity region 20s in the photosensor 100A and the transfer transistor 70a, and that is indirectly connected to the second signal detection transistor 75b. A transfer control line 45b and an address control line 44b, which are both connected to the vertical scanning circuit 14, are connected respectively to a gate of the transfer transistor 70b and a gate of the address transistor 30b. One end of the capacitor 72b is connected to a node Nd between the transfer transistor 70b and the address transistor 30b.

Figure 8:
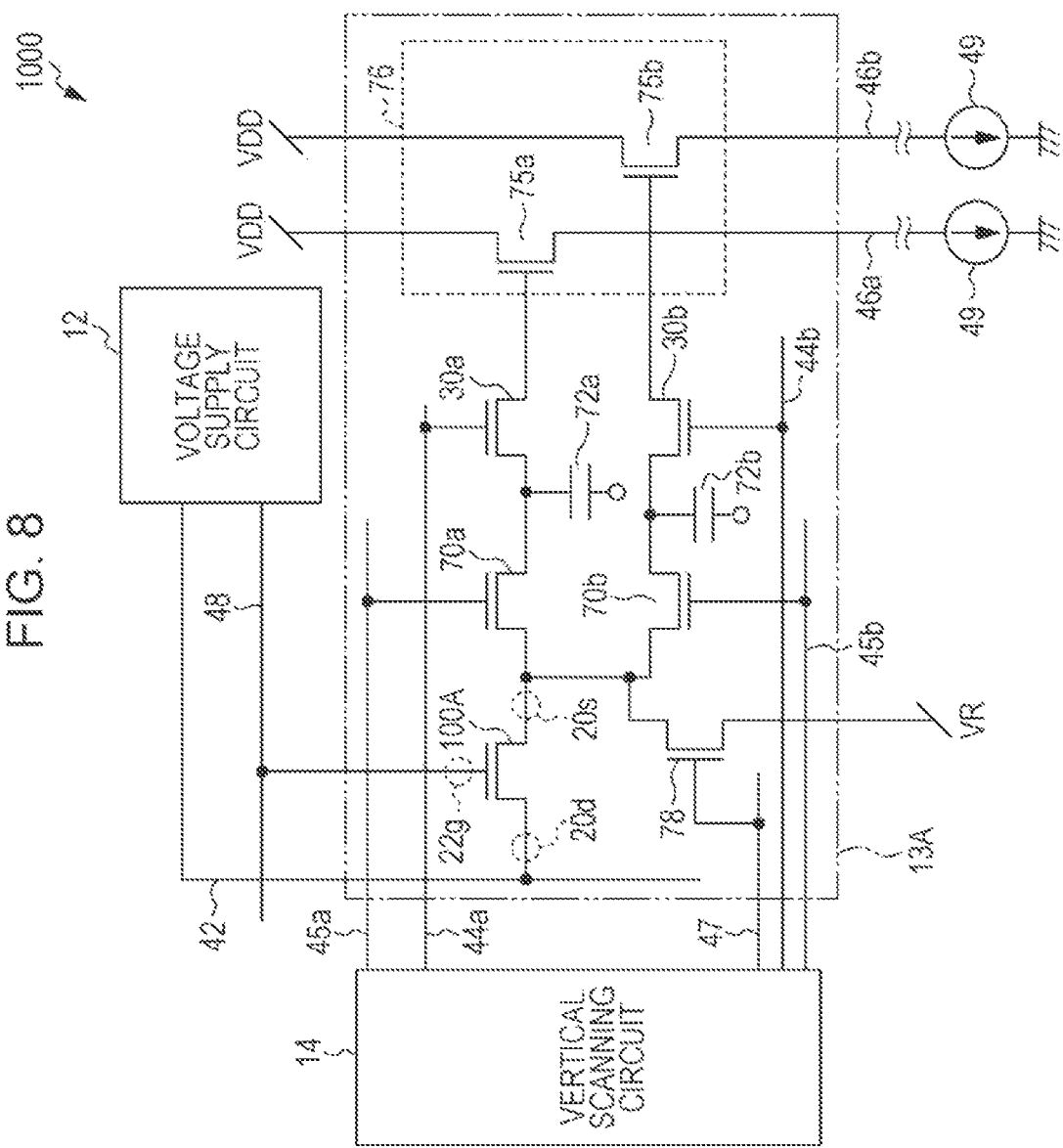
FIG. 8 is a schematic view illustrating still another example of circuit configuration of the unit pixel cell, which can be applied to the optical sensor.

In the circuit configuration illustrated in FIG. 8, the transfer transistors 70a and 70b are typically turned on in periods different from each other. In other words, the charge accumulation period in the transfer transistor 70a and the charge accumulation period in the second transfer transistor 70b are different from each other. The first transfer transistor 70a is turned on during a first period of a certain length, and the capacitor 72a accumulates signal charges in an amount corresponding to the light incident upon the photosensor 100A during the first period in which the transfer transistor 70a has been kept turned on. On the other hand, the second transfer transistor 70b is turned on during a second period of a certain length, for example, after the first period. The capacitor 72b accumulates signal charges in an amount corresponding to the light incident upon the photosensor 100A during the second period. By turning on the address transistor 30a in a state where the second address transistor 30b, the second transfer transistor 70b, and the transfer transistor 70a are turned off, the signal charges accumulated in the capacitor 72a during the first period are read out to the vertical signal line 46a through the signal detection transistor 75a. By turning off the address transistor 30a and turning on the second address transistor 30b from the above state, the signal charges accumulated in the capacitor 72b during the second period are read out to the vertical signal line 46b through the signal detection transistor 75b. The vertical signal line may be disposed for each signal detection transistor as illustrated in FIG. 8. Alternatively, the signal detection circuit 76 may include a switching circuit that selectively connects one of outputs of plural signal detection transistors to one common vertical signal line.

Thus, by disposing two or more capacitors (i.e., the capacitors 72a and 72b in the illustrated example) in the unit pixel cell, the light can be detected at different multiple phases and signals corresponding to the different phases can be separately read out in spite of using a single pixel. It is hence possible to realize, for example, a multi-phase global shutter operation in which exposure periods are different from one another, and multi-phase TOF range sensing in which light detection is performed using a desired plural number of time windows. Lengths of the plurality of charge accumulation periods corresponding to the plurality of transfer transistors may be all the same, or may be different in all or part. The plurality of charge accumulation periods may be all separated from one another, or may be overlapped in all or part in terms of time.

In the illustrated example, the single reset transistor 78 is connected to the impurity region 20s. In that circuit configuration, the charges accumulated in the capacitor 72a and the charges accumulated in the capacitor 72b can be reset together by turning on the reset transistor 78 and the transfer transistors 70a and 70b at the same time. In other words, the correlated double sampling can be executed by employing a common reset level among a plurality of branches. As a matter of course, separate reset transistors may be connected respectively to the node between the transfer transistor 70a and the address transistor 30a and between the transfer transistor 70b and the address transistor 30b. A common reset level can be used among the plurality of branches by setting a common reset voltage VR among the plurality of reset transistors.

Figure 9:
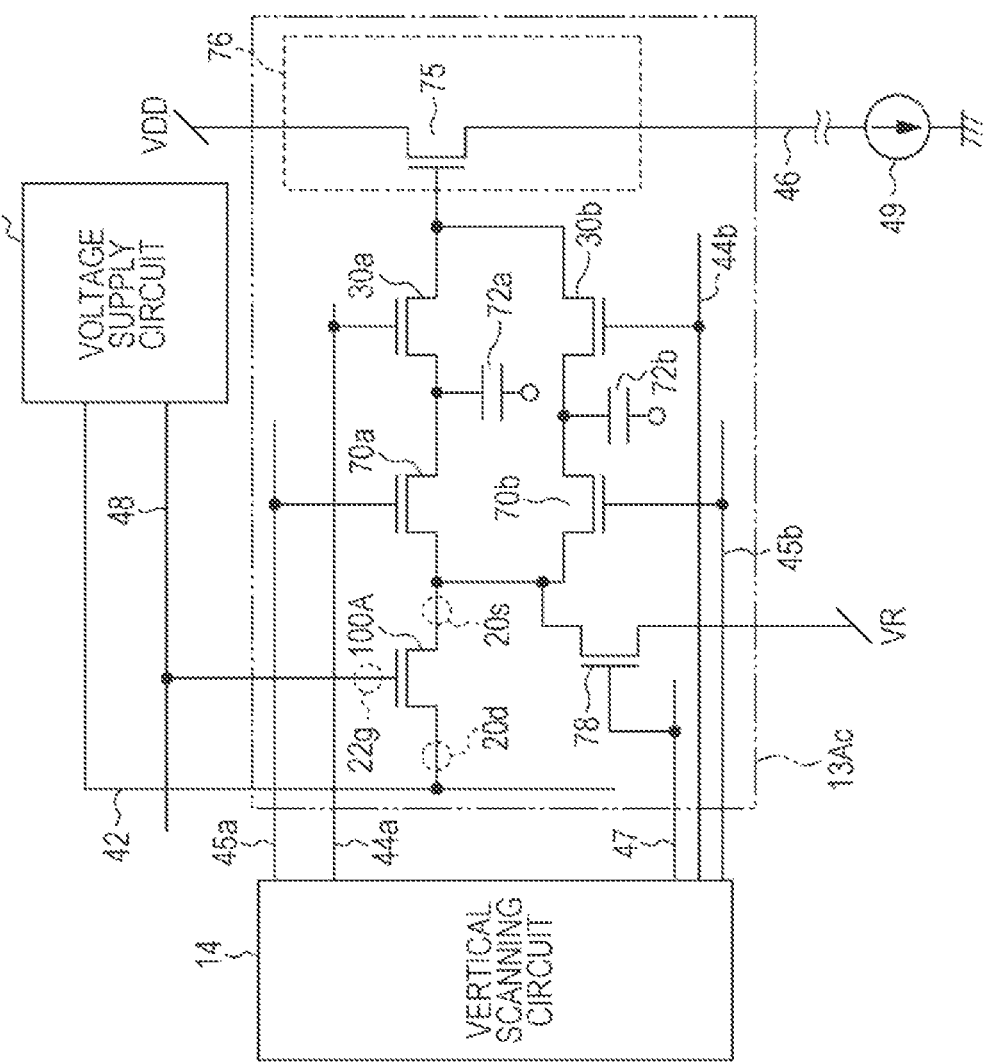
FIG. 9 is a schematic view illustrating still another example of circuit configuration of the unit pixel cell, which can be applied to the optical sensor.

Like a unit pixel cell 13Ac illustrated in FIG. 9, the signal detection circuit 76 may include a single common signal detection transistor 75. Either the signal charges accumulated in the capacitor 72a or the signal charges accumulated in the capacitor 72b can be selectively read out by selectively turning on one of the address transistors 30a and 30b. Noise generated during reading-out attributable to characteristic variations among the plurality of signal detection transistors can be reduced by reading out the output signals through the single signal detection transistor 75.

Figure 10:
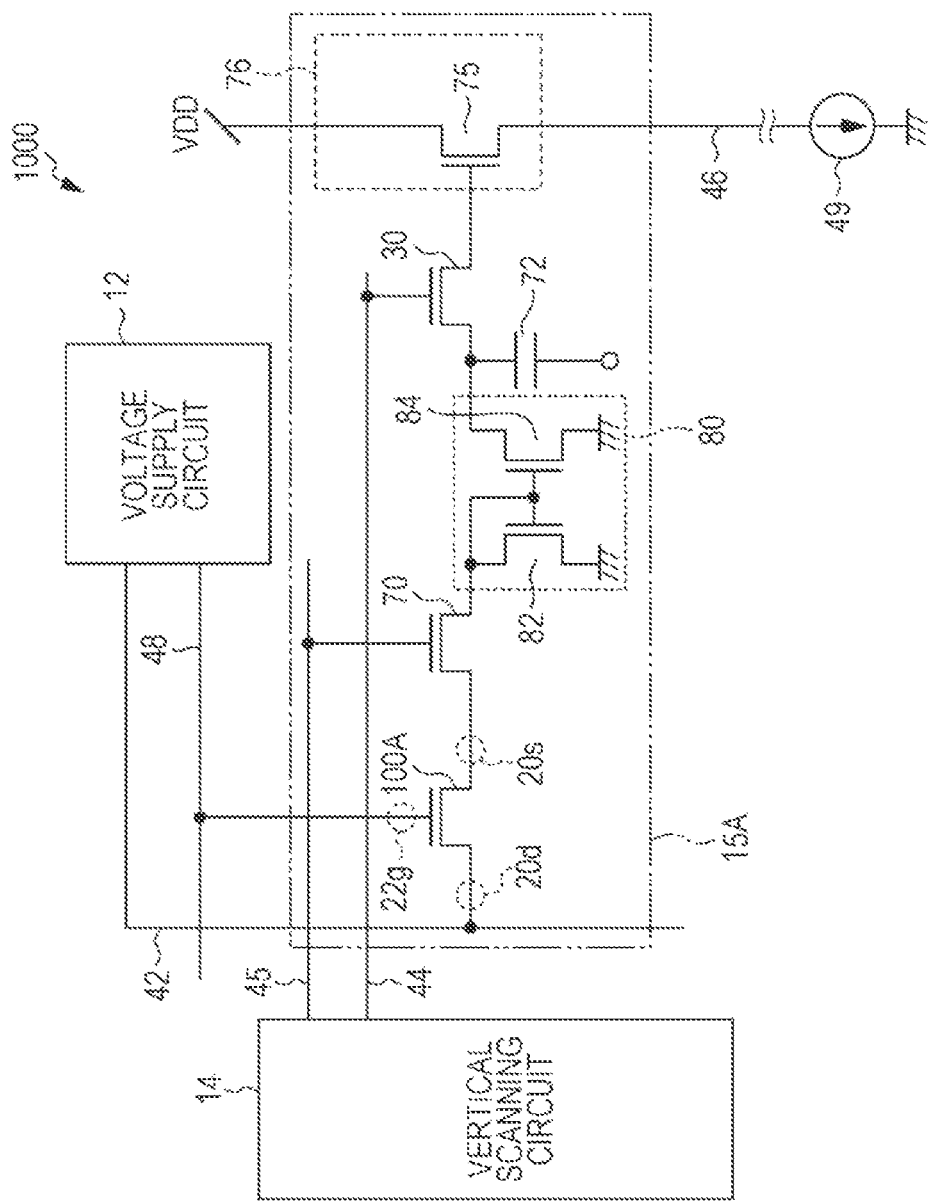
FIG. 10 is a schematic view illustrating still another example of circuit configuration of the unit pixel cell, which can be applied to the optical sensor.

FIG. 10 illustrates an example of circuit configuration of a unit pixel cell 15A including a current amplifier circuit 80. It is to be noted that the reset transistor is omitted in FIG. 10. Also in the drawings subsequent to FIG. 10, the reset transistor is omitted in some cases.

In the configuration illustrated in FIG. 10, the current amplifier circuit 80 is connected between the transfer transistor 70 and the address transistor 30. Here, one end of the capacitor 72 is connected to an output stage of the current amplifier circuit 80.

The current amplifier circuit 80 may be constituted as a current mirror circuit, for example, as illustrated in FIG. 10. More specifically, the current amplifier circuit 80 includes transistors 82 and 84 of which gates are connected to each other. As illustrated in the drawing, a gate and a drain of the transistor 82 are connected to each other (diode connection). A ratio of an output current to an input current can be optionally modified by changing a size (typically a channel width) between the transistors 82 and 84.

As described above, the threshold voltage of the field effect transistor that is assumed in place of the photosensor 100A is changed depending on a change of the illuminance applied to the photosensor 100A. Accordingly, a current corresponding to the illuminance is output from the impurity region 20s. The current on the output side to which one end of the capacitor 72 is connected can be increased by connecting the current amplifier circuit 80 to, for example, the impurity region 20s through the transfer transistor 70 as illustrated in FIG. 10. Thus, the signal detection with higher sensitivity can be realized by converting the current, which has been amplified, to a voltage signal. Layout for connection of the current amplifier circuit 80 is not limited to the example illustrated in FIG. 10, and a similar advantageous effect can also be obtained in the case of connecting the current amplifier circuit 80 between the impurity region 20s and the transfer transistor 70.

Figure 11:
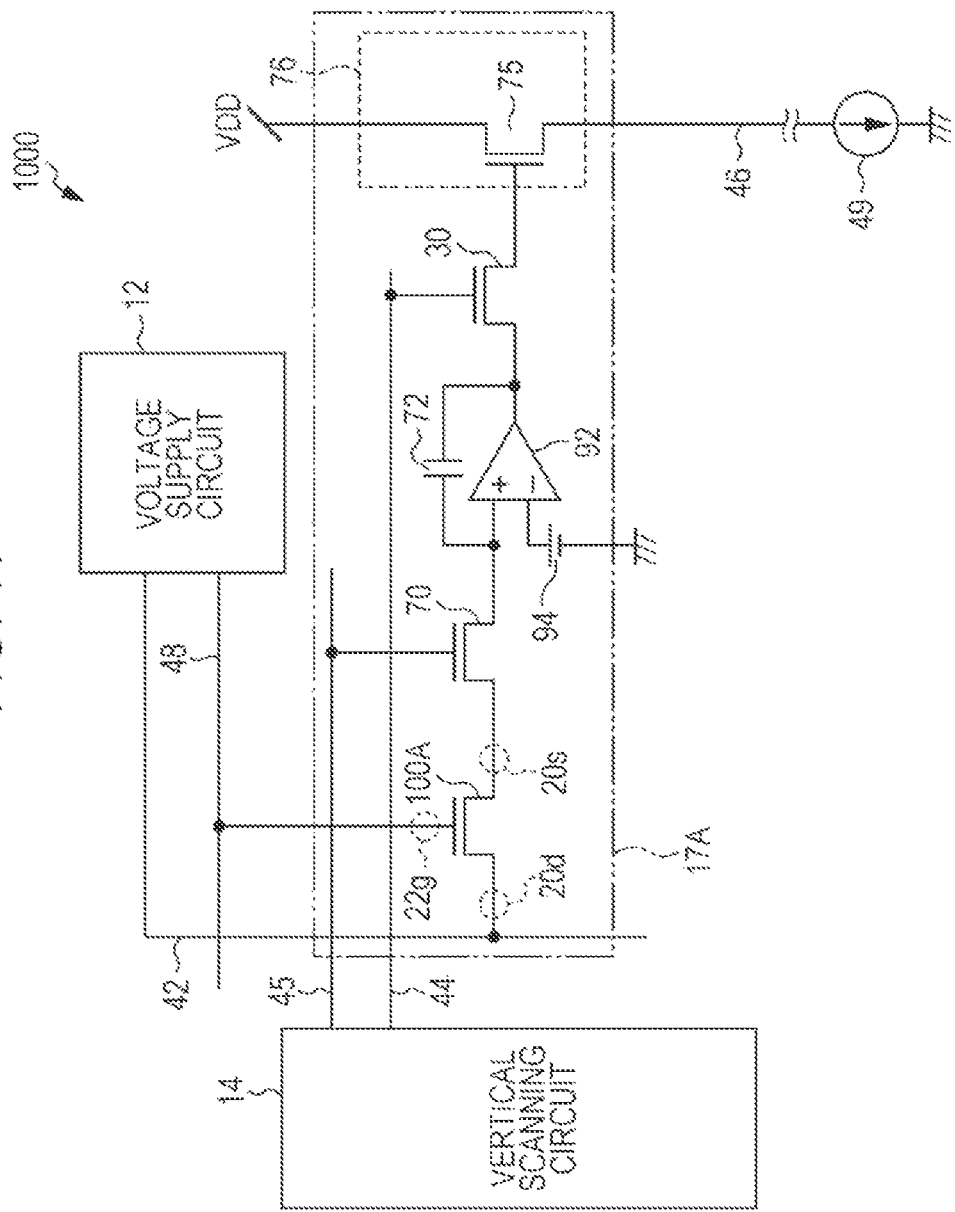
FIG. 11 is a schematic view illustrating still another example of circuit configuration of the unit pixel cell, which can be applied to the optical sensor.

FIG. 11 illustrates an example of circuit configuration in which an inverting amplifier is disposed in the unit pixel cell. A unit pixel cell 17A illustrated in FIG. 11 includes an inverting amplifier 92 that is connected between the transfer transistor 70 and the address transistor 30. A non-inverting input terminal of the inverting amplifier 92 is connected to the impurity region 20s through the transfer transistor 70, and an output terminal of the inverting amplifier 92 is connected to the address transistor 30. A power supply 94 is connected to an inverting input terminal of the inverting amplifier 92. During the operation of the optical sensor 1000, a potential at the inverting input terminal is fixedly held by a voltage applied from the power supply 94.

As described before, in the optical sensor 1000, the detection of the light is performed in the state where the potential difference between the impurity region 20d and the transparent gate electrode 22g is held constant. On that occasion, a current output from the impurity region 20s depends on a voltage at the node on the output side connected to the impurity region 20s (i.e., a voltage at the source or the drain of the transfer transistor 70 in the illustrated example). By disposing, within the unit pixel cell 17A, the inverting amplifier 92 having the inverting input terminal to which the power supply 94 is connected, as illustrated in FIG. 11, voltage variations (such as a variation per reset and a variation per unit pixel cell) at the node on the output side of the photosensor 100A can be suppressed.

In the illustrated example, one end and the other end of the capacitor 72 are connected respectively to the non-inverting input terminal and the output terminal of the inverting amplifier 92. Accordingly, during the detection of the light, signal charges in an amount corresponding to the illuminance applied to the photosensor 100A are accumulated in the capacitor 72 with a reference given as a potential at the inverting input terminal to which the power supply 94 is connected. According to the circuit configuration illustrated in FIG. 11, since the reference potential in the capacitor 72 can be fixedly held at a constant level with the voltage applied from the power supply 94, the voltage variations at the node on the output side of the photosensor 100A can be suppressed. As a result, an influence on dependency of the current output from the impurity region 20s upon the voltage variations at the node on the output side of the photosensor 100A can be reduced, and linearity between the illuminance and the output signal from the unit pixel cell 17A can be improved.

Figure 12:
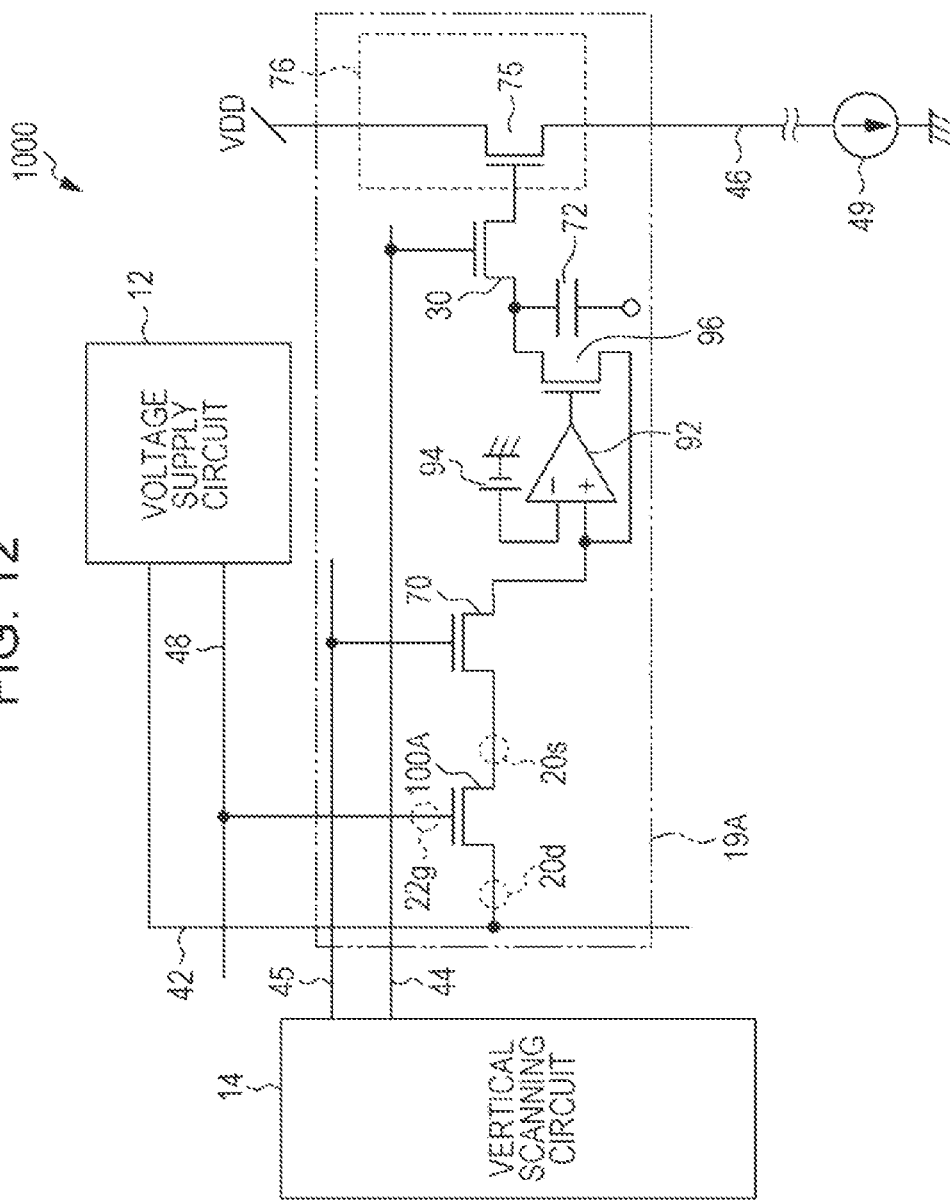
FIG. 12 is a schematic view illustrating still another example of circuit configuration of the unit pixel cell, which can be applied to the optical sensor.

As illustrated in FIG. 12, an output of the inverting amplifier 92 may be fed back. A unit pixel cell 19A illustrated in FIG. 12 includes a feedback transistor 96 of which gate is connected to the output terminal of the inverting amplifier 92. A source and a drain of the feedback transistor 96 are connected respectively to the non-inverting input terminal of the inverting amplifier 92 and the address transistor 30. In the illustrated example, one end of the capacitor 72 is connected between the feedback transistor 96 and the address transistor 30. Though not illustrated in FIG. 12, the reset transistor is connected to a node between the feedback transistor 96 and the address transistor 30.

In the circuit configuration illustrated in FIG. 12, a reset is first made to supply a comparatively high voltage to the node to which the one end of the capacitor 72 is connected. Then, the transfer transistor 70 is turned on during a desired period. In the illustrated example, since a feedback loop is formed by connecting the source of the feedback transistor 96 to the non-inverting input terminal of the inverting amplifier 92, a current flowing from the capacitor 72 to the photosensor 100A is generated with the light irradiation. By turning on the address transistor 30 after turning off the transfer transistor 70, an output signal corresponding to a potential fall from the reset potential in the capacitor 72 is read out, as a signal corresponding to the illuminance, to the vertical signal line 46. The inverting amplifier 92 may be connected between the impurity region 20s and the transfer transistor 70.

Second Embodiment

Figure 13:
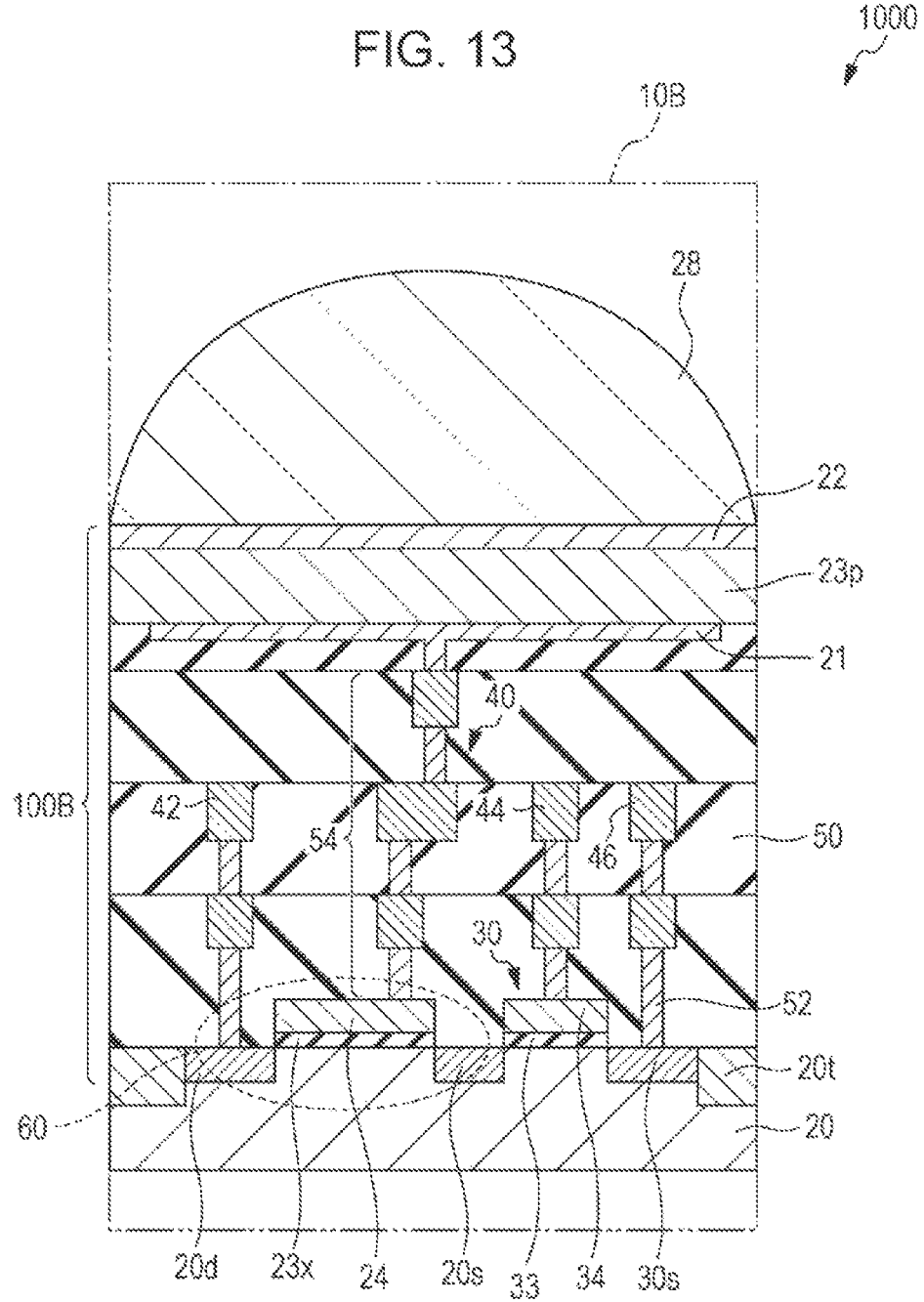
FIG. 13 is a schematic sectional view illustrating a section of an optical sensor according to a second embodiment of the present disclosure.

The device structure of the photosensor in the optical sensor 1000 of the present disclosure is not limited to that described above with reference to FIG. 1. FIG. 13 schematically illustrates a section of an optical sensor according to a second embodiment of the present disclosure. In the second embodiment, the optical sensor 1000 includes a plurality of unit pixel cells 10B each including a photosensor 100B. In FIG. 13, for the sake of avoiding the drawing from being complicated, only one of the unit pixel cells 10B is illustrated, and the signal detection circuit 76, etc. are omitted.

In the configuration illustrated in FIG. 13, the photosensor 100B includes a capacitance-modulated transistor 60 and a photoelectric conversion portion. The capacitance-modulated transistor 60 is a field effect transistor formed in and on the semiconductor substrate 20. The capacitance-modulated transistor 60 includes an impurity region 20d, an impurity region 20s, an insulating layer 23x on a region sandwiched between the impurity region 20d and the impurity region 20s in the semiconductor substrate, and a gate electrode 24 on the insulating layer 23x. The impurity region 20d functions as a drain region (or a source region) of the capacitance-modulated transistor 60, and the impurity region 20s functions as the source region (or the drain region) of the capacitance-modulated transistor 60. As in the first embodiment, the impurity region 20d is connected to the power supply wiring line 42 such that the predetermined voltage (first bias voltage) can be applied to the impurity region 20d during the operation of the optical sensor 1000. The insulating layer 23x serves as a gate insulating layer of the capacitance-modulated transistor 60. The insulating layer 23x is a thermal oxide film of silicon with a thickness of 4.6 nm, for example.

The photoelectric conversion portion of the photosensor 100B includes a pixel electrode 21, a transparent electrode 22 opposing to the pixel electrode 21, and a photoelectric conversion layer 23p sandwiched between the pixel electrode 21 and the transparent electrode 22. The pixel electrode 21 is spatially separated from other adjacent pixel cells 10B, whereby it is electrically isolated from the pixel electrodes 21 of the other pixel cells 10B. The pixel electrode 21 is typically a metal electrode or a metal nitride electrode. Examples of materials usable to form the pixel electrode 21 are Al, Cu, Ti, TiN, Ta, TaN, Mo, Ru, and Pt. Alternatively, the pixel electrode 21 may be formed of, for example, polysilicon that is doped with impurities to be given with conductivity. In this embodiment, a TiN electrode is used as the pixel electrode 21.

Unlike in the first embodiment, the photoelectric conversion layer 23p is formed to extend up to regions of the other unit pixel cells 10B. The photoelectric conversion layer 23p may have a thickness of about 200 nm, for example. Like the transparent gate electrode 22g in the first embodiment, the transparent electrode 22 is formed to extend up to regions of the other unit pixel cells 10B by employing a TCO. Furthermore, the transparent electrode 22 is connected to the gate voltage control line 48 (not illustrated in FIG. 13, see FIG. 14) such that the predetermined voltage (second bias voltage) can be applied to the transparent electrode 22 during the operation of the optical sensor 1000.

In the illustrated example, the transparent electrode 22 and the photoelectric conversion layer 23p are arranged on the interlayer insulating layer 50. The pixel electrode 21 of the photoelectric conversion portion and the gate electrode 24 of the capacitance-modulated transistor 60 are connected to each other by a connector 54, which includes part of the multilayer wiring 40 and a contact plug 52. It can be roughly said that the photosensor 100B according to the second embodiment has a structure in which an electrode (constituted by the pixel electrode 21, the connector 54, and the gate electrode 24 in the illustrated example) is interposed between the photoelectric conversion layer 23p and the insulating layer 23x in the photosensor 100A (see FIG. 1) according to the first embodiment. Stated in another way, the capacitance-modulated transistor 60 can be regarded as including a gate that includes serial connection of a capacitor having the insulating layer 23x as a dielectric layer and a capacitor having the photoelectric conversion layer 23p as a dielectric layer. In the latter case, it can be said that a multilayer structure including the pixel electrode 21, the connector 54, and the gate electrode 24 between the insulating layer 23x and the photoelectric conversion layer 23p constitutes a gate capacitance (which may also be called a gate insulating layer) in the capacitance-modulated transistor 60, and that the transparent electrode 22 constitutes a gate electrode in the capacitance-modulated transistor 60.

The principle of light detection in the optical sensor 1000 according to the second embodiment is substantially the same as that in the first embodiment. More specifically, in a state where a bias voltage within the above-described third voltage range is applied to the photoelectric conversion layer 23p, light is incident upon the photoelectric conversion layer 23p through the transparent electrode 22. The voltage applied to the impurity region 20d is 2.4 V, for example. The voltage applied to the transparent electrode 22 is 2.5 V, for example. Thus, a resultant bias voltage of about 0.1 V is, as a whole, applied to the insulating layer 23x, which serves as the gate insulating layer of the capacitance-modulated transistor 60, and the photoelectric conversion layer 23p.

With incidence of light upon the photoelectric conversion layer 23p, hole-electron pairs, for example, are generated inside the photoelectric conversion layer 23p, and the dielectric constant between the pixel electrode 21 and the transparent electrode 22 is changed. With the change of the dielectric constant between the pixel electrode 21 and the transparent electrode 22, an effective gate voltage of the capacitance-modulated transistor 60 is changed, and a threshold voltage of the capacitance-modulated transistor 60 is also changed. Accordingly, a change of illuminance of the incident light can be detected, for example, as a voltage change in the vertical signal line 46.

According to the second embodiment, since the photoelectric conversion layer 23p is arranged on the interlayer insulating layer 50, a degree of freedom in layout of various wirings in the multilayer wiring 40 becomes higher than that obtained with the structure (see FIG. 1) in which the photoelectric conversion layer 23p is buried in the interlayer insulating layer 50. In the configuration illustrated in FIG. 13, an aperture ratio in the unit pixel cell 10B is given by a ratio of a region where the pixel electrode 21 and the transparent electrode 22 overlap with each other in the unit pixel cell 10B when the unit pixel cell 10B is viewed from the normal direction of the semiconductor substrate 20. Therefore, a larger aperture ratio can be more easily obtained than in the case of employing the structure (see FIG. 1) that the photoelectric conversion layer 23p is buried in the interlayer insulating layer 50.

Furthermore, the layout of the photoelectric conversion layer 23p being arranged on the interlayer insulating layer 50 has less difficulty in a manufacturing process than the layout of the photoelectric conversion layer 23p being buried in the interlayer insulating layer 50, and the former layout is more advantageous from the viewpoint of manufacturing. When the gate electrode 24 of the capacitance-modulated transistor 60 and the gate electrode 34 of the address transistor 30 are both polysilicon electrodes, the gate of the address transistor 30 can be formed at the same time as forming the gate of the capacitance-modulated transistor 60.

In another example, when the gate electrode 24 of the capacitance-modulated transistor 60 and the gate electrode 34 of the address transistor 30 are formed using different materials, those gate electrodes need to be formed successively. In the case of forming the gate electrode 24 and the gate electrode 34 and injecting impurities with the lithography technique, it is generally difficult to avoid a deviation in alignment between the gate electrode 24 and the gate electrode 34. Thus, in trying to form the gate electrode 24 of the capacitance-modulated transistor 60 and the gate electrode 34 of the address transistor 30 by using different materials, a margin needs to be set for ensuring the alignment. In other words, using different materials is disadvantageous from the viewpoint of reducing the size of the unit pixel cell in the optical sensor.

By arranging, as illustrated in FIG. 13, the gate electrode 24 of the capacitance-modulated transistor 60 and the gate electrode 34 of the address transistor 30 to be positioned in the same layer (i.e., at a common level), both the gate electrodes can be formed together at desired positions and in desired shapes by employing a common mask and a common material without taking into account a deviation in the alignment. Similarly, by arranging the insulating layer 23x of the capacitance-modulated transistor 60 and the gate insulating layer 33 of the address transistor 30 to be positioned in the same layer, both the gate insulating layers can be formed together at desired positions and in desired shapes by employing a common mask and a common material without taking into account a deviation in the alignment. Accordingly, the pixels can be formed in smaller sizes. The manufacturing cost can be further reduced by designing a gate structure of the capacitance-modulated transistor 60 and a gate structure of the address transistor 30 in common to each other.

Likewise, the gate structure of the capacitance-modulated transistor 60 may be designed in common to that of at least part of the signal detection transistor 75, the transfer transistor 70, the reset transistor 78, the transistors in the current amplifier circuit 80 (i.e., the transistors 82 and 84 in the example of FIG. 10), and the feedback transistor 96. Among those transistors, for example, a common material may be used, and their gate insulating layers and/or gate electrodes may be formed in the same layer. By designing the gate structures in common to each other, deviations in alignment in forming those transistors can be reduced. Furthermore, in at least part of those transistors, the gate insulating layer may be formed as an insulating layer with a light-shielding property.

In the above-described first embodiment, the photosensor 100A does not include an electrode corresponding to the gate electrode 24 of the capacitance-modulated transistor 60 (see FIG. 1). However, the insulating layer 23x of the photosensor 100A and, for example, the gate insulating layer 33 of the address transistor 30 can be formed by employing a common mask and a common material. This makes it possible to eliminate the necessity of alignment in the case of forming the gate insulating layer 33 after forming the insulating layer 23x, or the necessity of alignment in the case of forming the insulating layer 23x after forming the gate insulating layer 33. Thus, a positional deviation between the insulating layer 23x and the gate insulating layer 33 can be eliminated by designing the insulating layer 23x and the gate insulating layer 33 to be positioned in the same layer.

By forming the pixel electrode 21 as an electrode with a light-shielding property, stray light can be suppressed from entering the channel region of the capacitance-modulated transistor 60 and/or channel regions of other transistors (such as the address transistor 30) formed in and on the semiconductor substrate 20. An optical filter, such as an infrared transmission filter, may be disposed between the transparent electrode 22 and the microlens 28.

The device structure illustrated in FIG. 13 apparently seems like a device structure of a stacked image sensor in which a photoelectric conversion layer is disposed on a semiconductor substrate. In the stacked image sensor, however, a comparatively high bias voltage is applied between a pixel electrode and a transparent electrode opposing to the pixel electrode, and ones of holes and electrons both generated in the photoelectric conversion layer with light irradiation are collected as signal charges to the pixel electrode. The collected signal charges are temporarily accumulated in a floating diffusion within a unit pixel cell, and a signal voltage corresponding to an amount of the accumulated charges is read out at predetermined timing.

On the other hand, in the typical example of the photosensor of the present disclosure, positive and negative charges (e.g., holes and electrons) generated in the photoelectric conversion layer 23p are not drifted toward the electrodes, and an electrical signal corresponding to a change of the dielectric constant of the photoelectric conversion layer 23p (i.e., the dielectric constant between the pixel electrode 21 and the transparent electrode 22 in the example of FIG. 13) is read out. Only ones of the holes and the electrons can be utilized as signal charges in the stacked image sensor, whereas the positive and negative charges (e.g., the holes and the electrons) are both utilized in pairs to cause a change of the threshold in the photosensor of the present disclosure. Hence higher sensitivity can be realized. Furthermore, since the potential difference applied between the upper surface and the lower surface of the photoelectric conversion layer 23p is set to the value within the above-mentioned third voltage range, the generated pairs of positive and negative charges (e.g., the holes and the electrons) promptly recombine when the light irradiation is stopped. Thus, unlike the stacked image sensor, an operation of resetting the potential of the pixel electrode is not required. In addition, the photosensor of the present disclosure does not perform an operation of accumulating the holes or the electrons, which are generated in the photoelectric conversion layer 23p, as the signal charges in the floating diffusion. For that reason, the semiconductor substrate 20 does not have a charge accumulation region to accumulate the charges generated in the photoelectric conversion layer 23p, unlike the stacked image sensor.

As described above, when the potential difference applied between the upper surface and the lower surface of the photoelectric conversion layer 23p is set to the value within the above-mentioned third voltage range, the generated pairs of holes and electrons are able to promptly recombine when the light irradiation is stopped. This implies that an output of the photosensor represents a variation corresponding to a change of the illuminance in the state under the light irradiation, and that the output does not depend on an integrated quantity of light. Accordingly, when the potential difference applied between the upper surface and the lower surface of the photoelectric conversion layer 23p is set to the value within the above-mentioned third voltage range, the timing of exposure and the timing of reading out a signal can be made coincident with each other.

As described with reference to FIGS. 7 to 12, the capacitor for temporarily accumulating the charges output from the photosensor may be disposed in the unit pixel cell. When the capacitor for temporarily accumulating the charges output from the photosensor 100B is disposed in the unit pixel cell, the output signal can be read out at desired timing different from the timing of exposure of the photosensor 100B.

Figure 14:
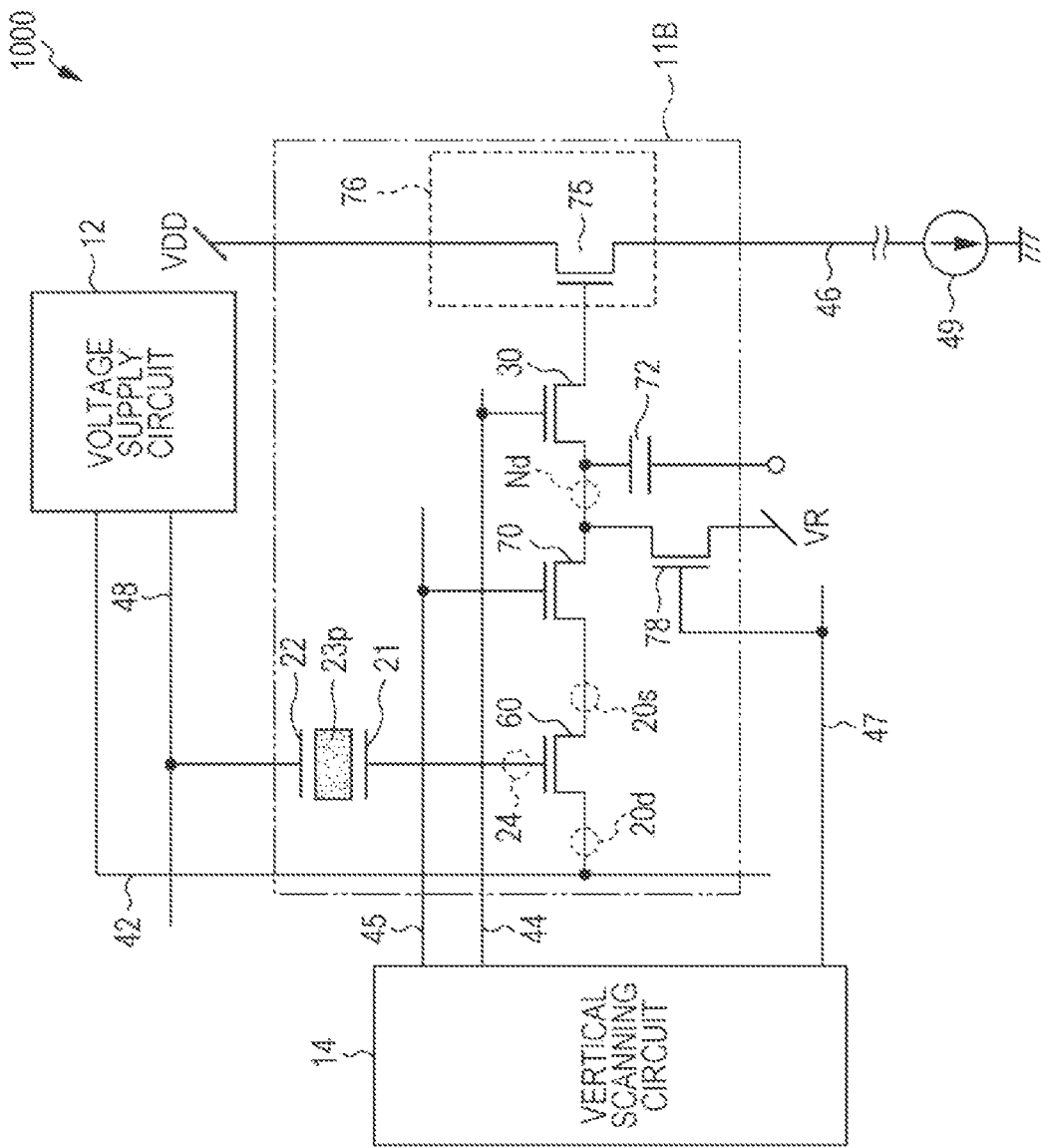
FIG. 14 is a schematic view illustrating an example of circuit configuration in which a photosensor in the circuit configuration illustrated in FIG. 7 is replaced with a photosensor illustrated in FIG. 13.

As illustrated in FIG. 14, for example, a transfer transistor 70 and a capacitor 72 may be disposed in the unit pixel cell according to this embodiment. As in the unit pixel cell 11A described above with reference to FIG. 7, a unit pixel cell 11B illustrated in FIG. 14 includes a signal detection circuit 76 including a signal detection transistor 75, and further includes the transfer transistor 70 and the address transistor 30 that are connected in series between the impurity region 20s in the photosensor 100B and a gate of the signal detection transistor 75. One end of the capacitor 72 is connected to a node Nd between the transfer transistor 70 and the address transistor 30. The unit pixel cell 11B illustrated in FIG. 14 can also be operated in a similar manner to that in the unit pixel cell 11A illustrated in FIG. 7.

Figure 15:
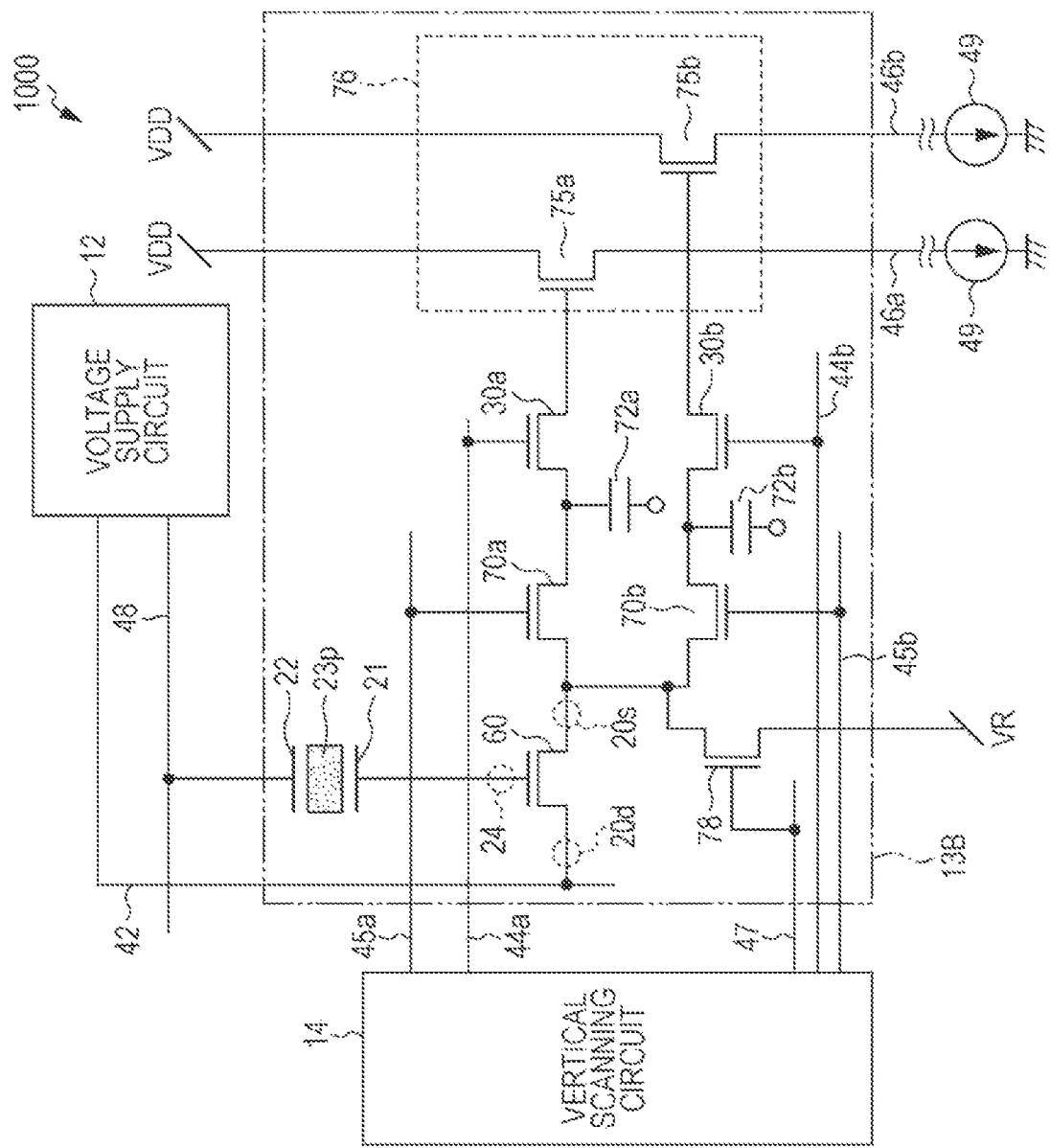
FIG. 15 is a schematic view illustrating an example of circuit configuration in which a photosensor in the circuit configuration illustrated in FIG. 8 is replaced with the photosensor illustrated in FIG. 13.

A unit pixel cell 13B illustrated in FIG. 15 includes a signal detection transistor 75a and a signal detection transistor 75b. Similarly to the signal detection transistor 75b, the signal detection transistor 75a is indirectly electrically connected to the impurity region 20s. In the illustrated example, a transfer transistor 70b and an address transistor 30b are connected between a gate of the signal detection transistor 75b and the impurity region 20s. As in the circuit configuration described above with reference to FIG. 8, a capacitor 72b is connected to a node between the transfer transistor 70b and the address transistor 30b.

Figure 16:
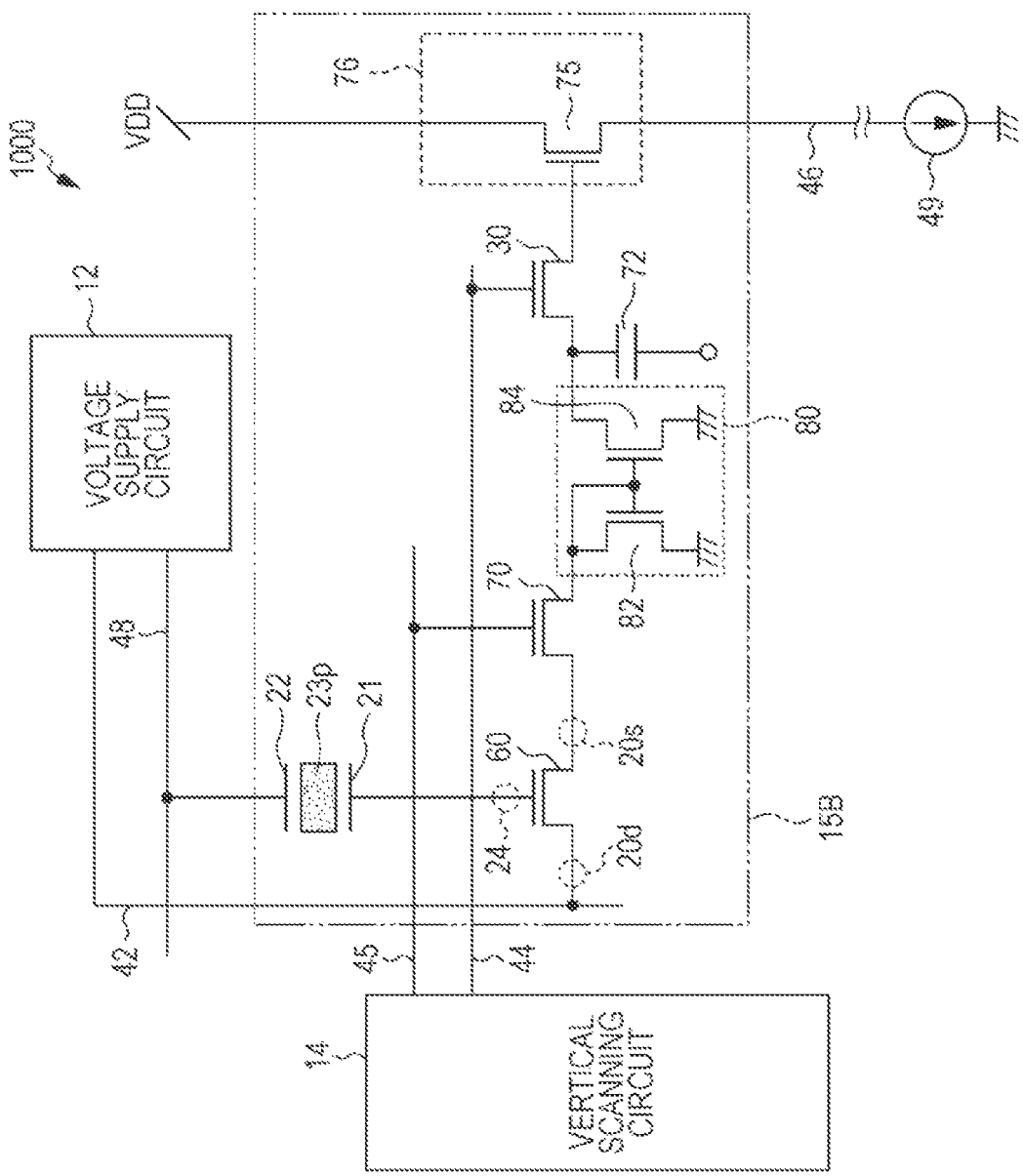
FIG. 16 is a schematic view illustrating an example of circuit configuration in which a photosensor in the circuit configuration illustrated in FIG. 10 is replaced with the photosensor illustrated in FIG. 13.
Figure 17:
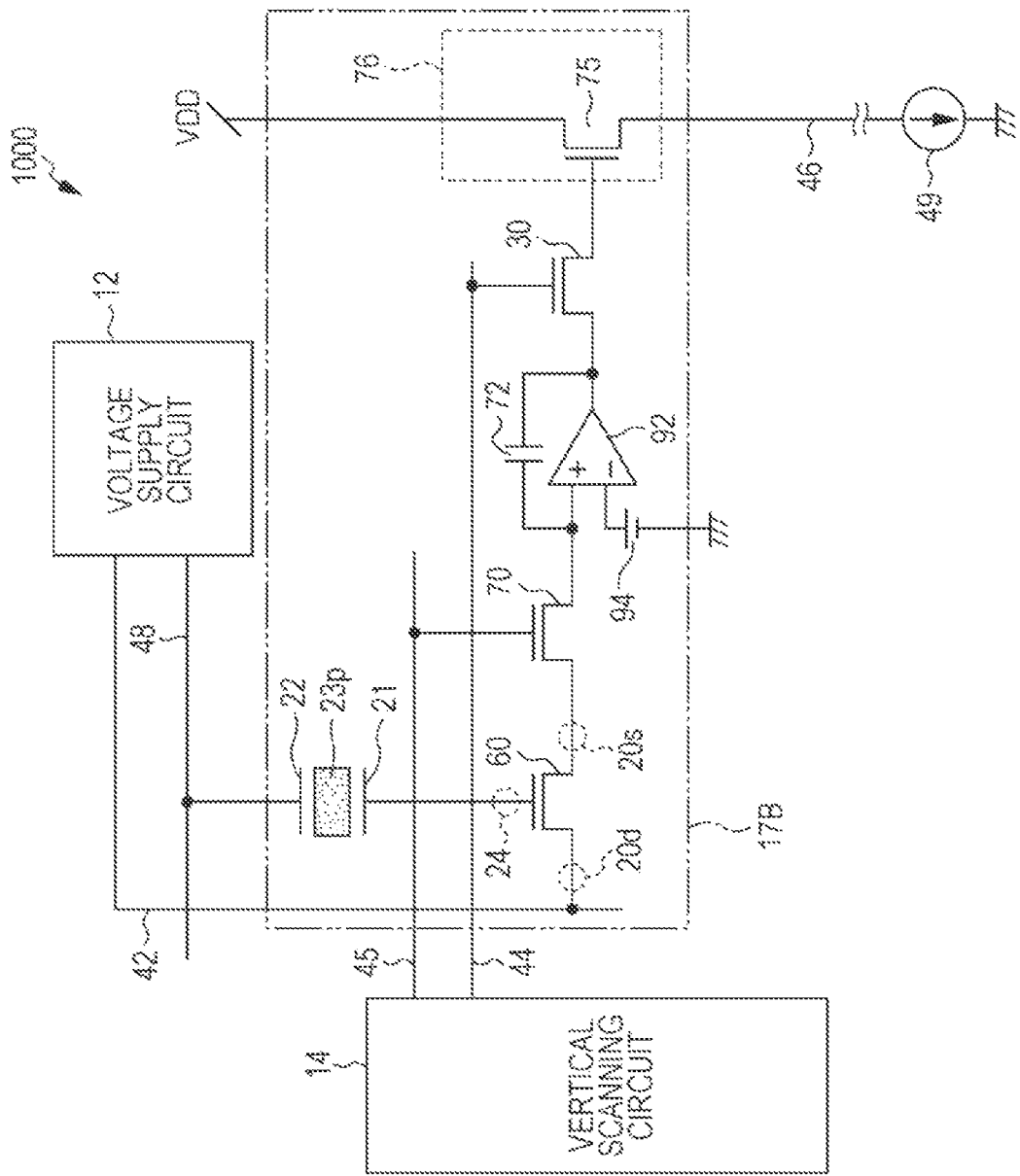
FIG. 17 is a schematic view illustrating an example of circuit configuration in which a photosensor in the circuit configuration illustrated in FIG. 11 is replaced with the photosensor illustrated in FIG. 13.
Figure 18:
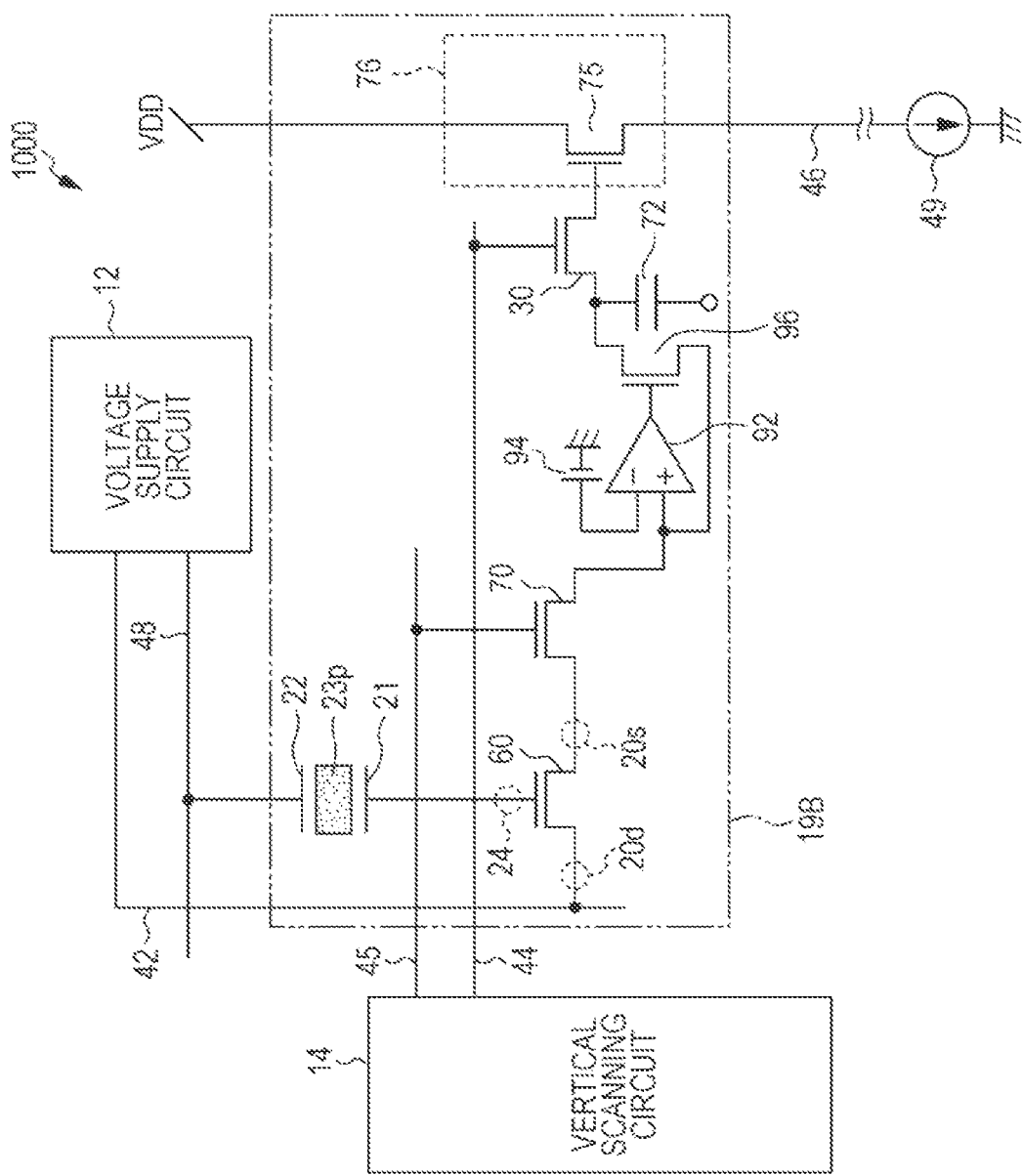
FIG. 18 is a schematic view illustrating an example of circuit configuration in which a photosensor in the circuit configuration illustrated in FIG. 12 is replaced with the photosensor illustrated in FIG. 13.

FIG. 16 illustrates an exemplary circuit configuration of a unit pixel cell 15B including a current amplifier circuit 80 that is connected between the impurity region 20s in the photosensor 100B and one end of the capacitor 72. FIG. 17 illustrates an exemplary circuit configuration of a unit pixel cell 17B including an inverting amplifier 92 that is connected between the impurity region 20s in the photosensor 100B and one end of the capacitor 72. FIG. 18 illustrates an exemplary circuit configuration of a unit pixel cell 19B including an inverting amplifier 92 that is connected between the impurity region 20s in the photosensor 100B and one end of the capacitor 72. The configuration illustrated in FIG. 17 represents an example in which opposite ends of the capacitor 72 are connected respectively to a non-inverting input terminal and an output terminal of the inverting amplifier 92, and the configuration illustrated in FIG. 18 represents an example in which an output of the inverting amplifier 92 is negatively fed back to the non-inverting input terminal thereof through a feedback transistor 96. As seen from FIGS. 14 to 18, application targets of the various circuit configurations described above in the first embodiment are not limited to the photosensor 100A, and those circuit configurations may be applied to, for example, the photosensor 100B instead of the photosensor 100A.

Third Embodiment

Figure 19:
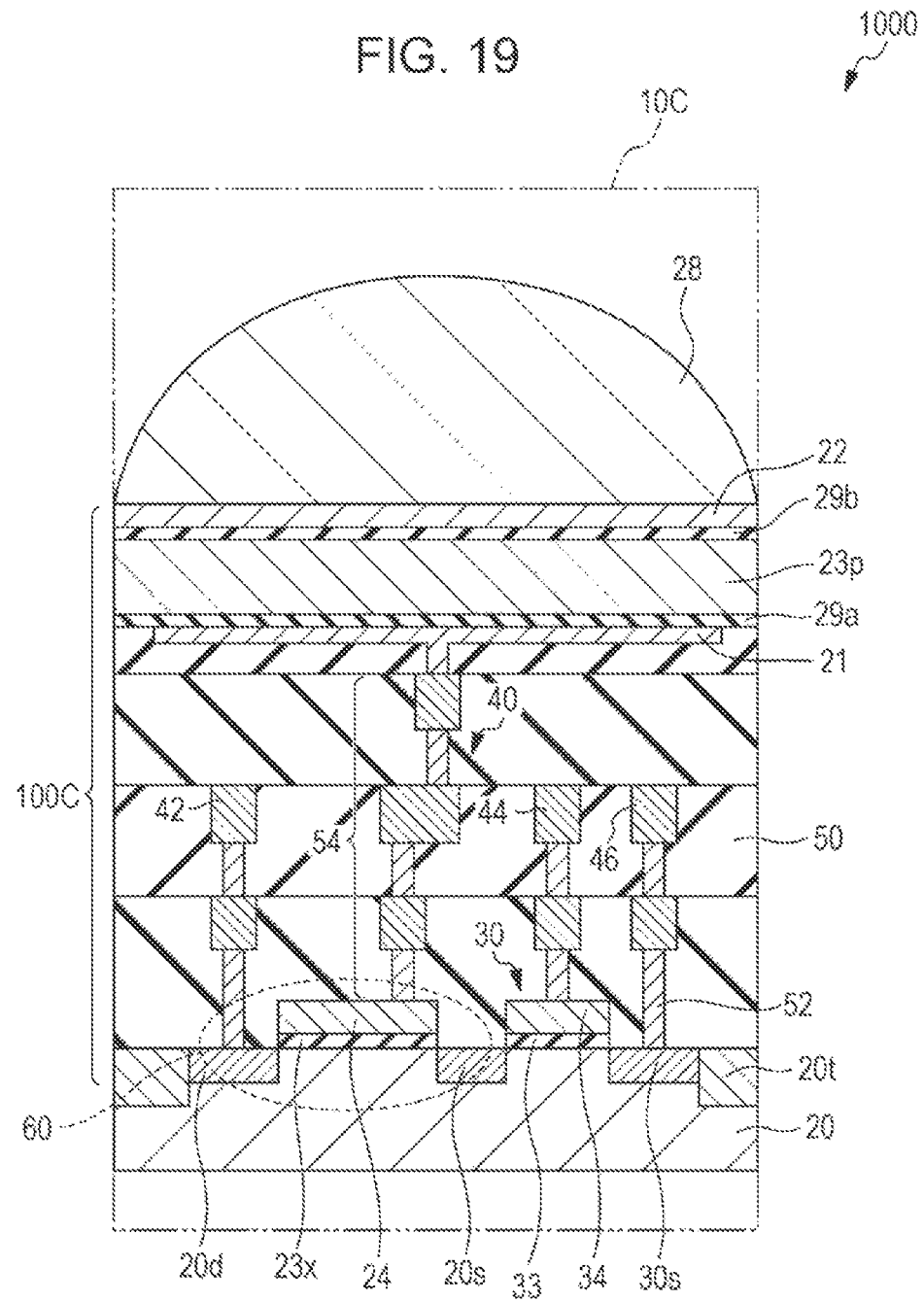
FIG. 19 is a schematic sectional view illustrating a section of an optical sensor according to a third embodiment of the present disclosure.

FIG. 19 schematically illustrates a section of an optical sensor according to a third embodiment of the present disclosure. A photosensor 100C in a unit pixel cell 10C, illustrated in FIG. 19, is different from the photosensor 100B in the second embodiment, described above with reference to FIG. 13, in that a photoelectric conversion portion of the photosensor 100C includes an insulating layer disposed between the photoelectric conversion layer 23p and an electrode or each of electrodes (i.e., one or each of a pixel electrode 21 and a transparent electrode 22). In a configuration illustrated in FIG. 19, insulating layers 29a and 29b are disposed respectively between the pixel electrode 21 and the photoelectric conversion layer 23p and between the photoelectric conversion layer 23p and the transparent electrode 22.

For example, a material exhibiting a smaller leak current than a material constituting the photoelectric conversion layer 23p can be selected to constitute the insulating layers 29a and 29b. In this embodiment, a silicon oxide film having a thickness of 5.4 nm is used as each of the insulating layers 29a and 29b. The silicon oxide film can be formed by CVD, for example.

According to the configuration illustrated in FIG. 19, since the insulating layers 29a and 29b are disposed respectively between the pixel electrode 21 and the photoelectric conversion layer 23p and between the photoelectric conversion layer 23p and the transparent electrode 22, a larger bias voltage can be applied between the drain region (or the source region) of the capacitance-modulated transistor 60 and the transparent electrode 22. In an example described below, a voltage of 3.7 V is applied as the first bias voltage to the impurity region 20d, and a voltage of 1.2 V is applied as the second bias voltage to the transparent electrode 22. Thus, in this embodiment, a potential difference of about 2.5 V is applied between the impurity region 20d and the transparent electrode 22.

Figure 20:
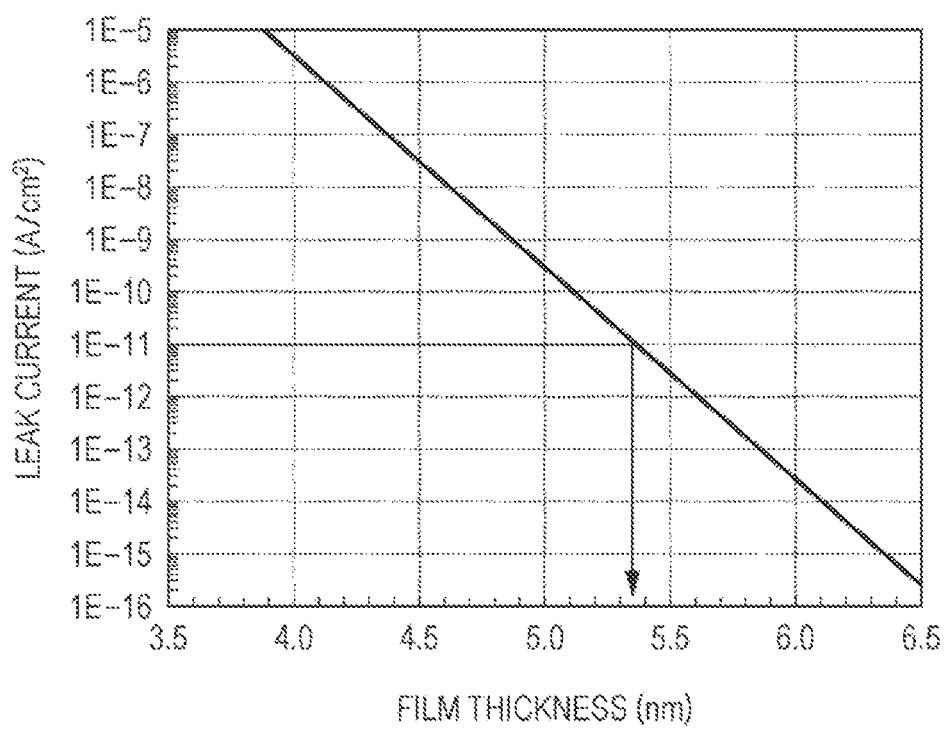
FIG. 20 is a graph depicting dependency, on a film thickness, of a leak current that flows in a silicon oxide film when a voltage of 2.5 V is applied.

FIG. 20 depicts dependency, on a film thickness, of a leak current that flows in a silicon oxide film when a voltage of 2.5 V is applied. As described before, it is advantageous, from the viewpoint of ensuring satisfactory characteristics in the state not under the light irradiation, that the leak current to the channel region of the capacitance-modulated transistor 60 is $1 \times 10^{-11}$ A/cm$^2$ or less. As seen from FIG. 20, when the voltage of 2.5 V is applied to the silicon oxide film, the leak current in the silicon oxide film can be reduced down to $1 \times 10^{-11}$ A/cm$^2$ or less by setting a thickness of the silicon oxide film to 5.4 nm or more.

Referring to FIG. 19 again, in the configuration illustrated in FIG. 19, the voltage applied between the impurity region 20d and the transparent electrode 22 is divided among the insulating layer 23x, the insulating layer 29a, the photoelectric conversion layer 23p, and the insulating layer 29b, each of which constitute a capacitor. Accordingly, a voltage actually applied to each of the insulating layer 23x, the insulating layer 29a, and the insulating layer 29b is about 0.8 V. In a strict sense, therefore, it is not necessary for each of the insulating layer 29a and the insulating layer 29b to have a thickness of 5.4 nm. In this embodiment, the thickness of each of the insulating layer 29a and the insulating layer 29b is set to a value of 5.4 nm, taking into account characteristic variations of silicon oxide films that are formed by CVD.

Thus, with the provision of at least one insulating layer (i.e., the insulating layer 29a and the insulating layer 29b in the illustrated example) between the photoelectric conversion layer 23p and the electrode, a larger bias voltage can be applied between the drain region (or the source region) of the capacitance-modulated transistor 60 and the transparent electrode 22. For example, the bias voltage providing a potential difference between the upper surface and the lower surface of the photoelectric conversion layer 23p, the potential difference falling within the above-mentioned first voltage range, may be applied between the drain region (or the source region) of the capacitance-modulated transistor 60 and the transparent electrode 22.

When the photoelectric conversion layer 23p is irradiated with the light in the state where the bias voltage within the first voltage range (see FIG. 5) is applied to the photoelectric conversion layer 23p, ones of positive and negative charges (e.g., holes and electrons) both generated with photoelectric conversion drift toward the transparent electrode 22, and the others drift toward the pixel electrode 21. Thus, in the case of applying the bias voltage within the first voltage range to the photoelectric conversion layer 23p, because the positive charges and the negative charges generated with the photoelectric conversion are separated, a time until the pairs of holes and electrons recombine after stopping the light irradiation is longer than that in the case of applying the bias voltage within the third voltage range to the photoelectric conversion layer 23p. Accordingly, the timing of exposure and the timing of reading out a signal are not always required to be coincident with each other. Since the timing of exposure and the timing of reading out a signal can be made different from each other in a comparatively easy manner, applying the bias voltage within the first voltage range to the photoelectric conversion layer 23p is advantageous from one point of view when the photosensor is applied to an image sensor.

In the state where the bias voltage within the first voltage range is applied to the photoelectric conversion layer 23p, the insulating layer 29a between the photoelectric conversion layer 23p and the pixel electrode 21 is able to function as a capacitor that accumulates ones of the positive and negative charges (e.g., the holes and the electrons) both generated with the photoelectric conversion. With the accumulation of charges in that capacitor, electrostatic induction occurs in the connector 54, whereby an effective gate voltage in the capacitance-modulated transistor 60 is changed. Accordingly, a threshold of the capacitance-modulated transistor 60 is changed. After the end of reading-out of the output signal, a reset operation of resetting the charges accumulated in the insulating layer 29a, which serves as a capacitor, is executed, for example, by applying a voltage having a polarity reversed to that of the second bias voltage to the transparent electrode 22. In another example, the charges accumulated in the insulating layer 29a, which serves as a capacitor, and the charges accumulated in the insulating layer 29b, which also serves as a capacitor, may be caused to recombine by blocking the light with a mechanical shutter, for example. As a matter of course, the operation of detecting the light may be performed in the state where the bias voltage within the above-mentioned third voltage range is applied to the photoelectric conversion layer 23p. In that case, the operation of resetting the charges accumulated in the insulating layer 29a is not needed.

Thus, the insulating layers may be disposed respectively between the photoelectric conversion layer 23p and the pixel electrode 21 and between the photoelectric conversion layer 23p and the transparent electrode 22. With the provision of the insulating layers between the photoelectric conversion layer 23p and the pixel electrode 21 and between the photoelectric conversion layer 23p and the transparent electrode 22, even when the potential difference between the impurity region 20d and the transparent electrode 22 is increased, the charges generated with the photoelectric conversion can be suppressed from drifting to the outside of the photoelectric conversion layer 23p. Hence the occurrence of a residual image can be suppressed. From the viewpoint of suppressing drift of the charges to the outside of the photoelectric conversion layer 23p, it is just needed to dispose the insulating layer at least one of boundaries between the photoelectric conversion layer 23p and the pixel electrode 21 and between the photoelectric conversion layer 23p and the transparent electrode 22. Instead of the silicon oxide film, a silicon nitride film, an aluminum oxide film, or the like may be used as the insulating layer 29a and/or the insulating layer 29b.

The photosensor 100C may also be used instead of the photosensor 100A in the circuit configuration described above with reference to FIGS. 7 to 12.

The above embodiments have been described in connection with the example in which the transistors in the unit pixel cell, such as the capacitance-modulated transistor 60 and the address transistor 30, are each an N-channel MOS. However, the transistors used in embodiments of the present disclosure are not limited to N-channel MOS's. The transistors in the unit pixel cell may be each an N-channel MOS or a P-channel MOS. Additionally, it is not always required that those transistors are all N-channel MOS's or P-channel MOS's. Other than FET's, bipolar transistors can also be used as the transistors in the unit pixel cell. For example, the address transistor 30 may be a bipolar transistor. Carriers in the channel formed between the impurity region 20d and the impurity region 20s in the photosensor 100A may be electrons or holes.

Camera System

Figure 21:
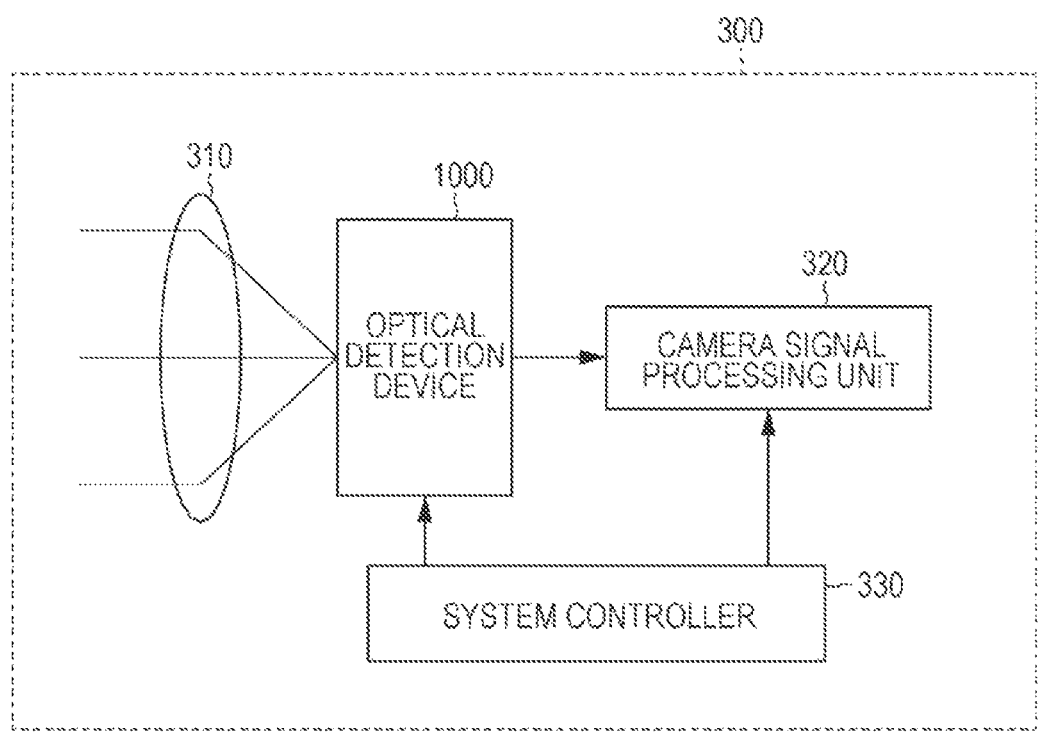
FIG. 21 is a block diagram illustrating an exemplary configuration of a camera system according to a fourth embodiment of the present disclosure.

FIG. 21 schematically illustrates an exemplary configuration of a camera system according to a fourth embodiment of the present disclosure. A camera system 300 illustrated in FIG. 21 includes a lens optical system 310, the above-described optical sensor 1000, a system controller 330, and a camera signal processing unit 320.

The lens optical system 310 includes, for example, an autofocusing lens, a zooming lens, and a diaphragm. The lens optical system 310 condenses light onto an imaging surface of the optical sensor 1000. When the photoelectric conversion layer 23p of the photosensor is formed of a material that exhibits absorption in the wavelength range of visible light, a color filter may be disposed on the imaging surface of the optical sensor 1000. The optical sensor 1000 may include, as peripheral circuits, a column signal processing circuit (also called a "row signal accumulation circuit"), a horizontal signal reading-out circuit (also called a "column scanning circuit"), etc.

The system controller 330 controls the entirety of the camera system 300. The system controller 330 may be implemented with a microcomputer, for example.

The camera signal processing unit 320 functions as a signal processing circuit that processes the output signal from the optical sensor 1000. The camera signal processing unit 320 executes processes such as gamma correction, a color interpolation process, a spatial interpolation process, and auto white balance. The camera signal processing unit 320 may be implemented with a digital signal processor (DSP), for example.

At least one of the system controller 330 and the camera signal processing unit 320 may be formed on the semiconductor substrate 20 of the optical sensor 1000. A size of the camera system 300 can be reduced by manufacturing, as a single semiconductor device, not only at least one of the system controller 330 and the camera signal processing unit 320, but also the optical sensor 1000.

The optical sensor of the present disclosure can be employed as an optical sensor, an image sensor, etc. The optical sensor can also take an image with infrared rays by appropriately selecting the material of the photoelectric conversion layer. The optical sensor taking an image with infrared rays can be applied to a security camera or a camera mounted on a vehicle, for example. The vehicle-mounted camera may be utilized, for example, to provide an input for a controller in order to ensure safe running of the vehicle. Alternatively, the vehicle-mounted camera may be utilized to assist an operator for the purpose of safe running of the vehicle.

What is claimed is:

1. An optical sensor comprising:
   a semiconductor layer including a source region and a drain region;
   a gate electrode facing a region between the source region and the drain region;
   a photoelectric conversion layer between the region and the gate electrode; and
   a first transistor having a first gate coupled to one of the source region and the drain region, wherein
   the source region is configured to function as a source of a transistor,
   the drain region is configured to function as a drain of the transistor, and
   the gate electrode is configured to function as a gate of the transistor.

2. The optical sensor according to claim 1, further comprising a first capacitor having one end coupled to the first gate.

3. The optical sensor according to claim 2, further comprising a second transistor coupled between the first gate and the one end.

4. The optical sensor according to claim 2, further comprising a current amplifier circuit coupled between the one end and the one of the source region and the drain region.

5. The optical sensor according to claim 2, further comprising an inverting amplifier coupled between the one end and the one of the source region and the drain region.

6. The optical sensor according to claim 1, further comprising a second transistor coupled between the first gate and the one of the source region and the drain region.

7. The optical sensor according to claim 6, further comprising a third transistor coupled between the first gate and the one of the source region and the drain region, in parallel to the second transistor.

8. The optical sensor according to claim 1, further comprising an insulating layer between the photoelectric conversion layer and the semiconductor layer.

9. The optical sensor according to claim 1, further comprising: a second transistor having a second gate coupled to the one of the source region and the drain region.

10. The optical sensor according to claim 1, wherein the source region, the drain region and the gate electrode constitute a field effect transistor.

11. An optical sensor comprising:
a first electrode;
a second electrode facing the first electrode;
a photoelectric conversion layer between the first electrode and the second electrode;
a first insulating layer between the second electrode and the photoelectric conversion layer;
a first transistor having a first gate, a first source and a first drain, the first gate being coupled to the first electrode; and
a second transistor having a second gate coupled to one of the first source and the first drain.

12. The optical sensor according to claim 11, further comprising a first capacitor having one end coupled to the second gate.

13. The optical sensor according to claim 12, further comprising a third transistor coupled between the one end and the second gate.

14. The optical sensor according to claim 12, further comprising a current amplifier circuit coupled between the one end and the one of the first source and the first drain.

15. The optical sensor according to claim 12, further comprising an inverting amplifier coupled between the one end and the one of the first source and the first drain.

16. The optical sensor according to claim 11, further comprising a third transistor coupled between the second gate and the one of the first source and the first drain.

17. The optical sensor according to claim 11, further comprising: a third transistor having a third gate coupled to the one of the first source and the first drain.

18. The optical sensor according to claim 11, wherein the second gate of the second transistor is configured to be electrically coupled to the one of the first source and the first drain.

19. The optical sensor according to claim 11, further comprising a second insulating layer between the first electrode and the photoelectric conversion layer.

20. An optical sensor comprising:
a first electrode;
a second electrode facing the first electrode;
a photoelectric conversion layer between the first electrode and the second electrode;
a first transistor having a first gate, a first source and a first drain, the first gate being coupled to the first electrode;
a second transistor having a second source and a second drain, one of the second source and the second drain being coupled to one of the first source and the first drain;
a third transistor having a third source and a third drain, one of the third source and the third drain being coupled to the other of the second source and the second drain;
a fourth transistor having a second gate coupled to the other of the third source and the third drain;
a first capacitor having one end coupled to a node between the second transistor and the third transistor; and
a fifth transistor having a fifth source and a fifth drain, one of the fifth source and the fifth drain being coupled to the node.

* * * * *